(12) United States Patent
Hung et al.

(10) Patent No.: US 11,004,812 B2
(45) Date of Patent: May 11, 2021

(54) PACKAGE STRUCTURE AND METHOD OF FORMING THE SAME

(71) Applicant: Taiwan Semiconductor Manufacturing Co., Ltd., Hsinchu (TW)

(72) Inventors: Tuan-Yu Hung, Changhua County (TW); Hung-Jui Kuo, Hsinchu (TW); Hsin-Yu Pan, Taipei (TW); Ming-che Ho, Tainan (TW); Tzu Yun Huang, Taipei (TW); Yen-Fu Su, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 16/133,705

(22) Filed: Sep. 18, 2018

(65) Prior Publication Data
US 2020/0091097 A1 Mar. 19, 2020

(51) Int. Cl.
*H01L 23/00* (2006.01)

(52) U.S. Cl.
CPC .............. *H01L 24/05* (2013.01); *H01L 24/13* (2013.01); *H01L 24/14* (2013.01); *H01L 2224/02313* (2013.01); *H01L 2224/02331* (2013.01); *H01L 2224/02375* (2013.01); *H01L 2224/02379* (2013.01); *H01L 2224/0401* (2013.01); *H01L 2224/05008* (2013.01); *H01L 2224/05088* (2013.01); *H01L 2224/05091* (2013.01); *H01L 2224/05092* (2013.01); *H01L 2224/05548* (2013.01); *H01L 2224/13024* (2013.01); *H01L 2224/1403* (2013.01); *H01L 2224/14051* (2013.01)

(58) Field of Classification Search
CPC . H01L 2224/05008; H01L 2224/05548; H01L 2224/02379
See application file for complete search history.

(56) References Cited

U.S. PATENT DOCUMENTS

| | | | | |
|---|---|---|---|---|
| 6,040,604 | A | * | 3/2000 | Lauvray ................. H01L 23/60 257/355 |
| 7,897,198 | B1 | * | 3/2011 | Park ..................... C23C 18/1651 427/265 |
| 9,000,584 | B2 | | 4/2015 | Lin et al. |
| 9,048,222 | B2 | | 6/2015 | Hung et al. |
| 9,048,233 | B2 | | 6/2015 | Wu et al. |
| 9,064,879 | B2 | | 6/2015 | Hung et al. |
| 9,111,949 | B2 | | 8/2015 | Yu et al. |
| 9,263,511 | B2 | | 2/2016 | Yu et al. |
| 9,281,254 | B2 | | 3/2016 | Yu et al. |

(Continued)

*Primary Examiner* — Laura M Menz
*Assistant Examiner* — Khatib A Rahman
(74) *Attorney, Agent, or Firm* — JCIPRNET

(57) ABSTRACT

A package structure is provided. The package structure includes a dielectric layer on a die, a RDL structure and a conductive terminal. The RDL structure comprises a redistribution layer in and on the dielectric layer. The redistribution layer comprises a via and a conductive plate. The via is located in and penetrating through the dielectric layer to be connected to the die. The conductive plate is on the via and the dielectric layer, and is connected to the die through the via. The conductive terminal is electrically connected to the die through the RDL structure. The via is ring-shaped.

20 Claims, 26 Drawing Sheets

(56) References Cited

U.S. PATENT DOCUMENTS

| | | | |
|---|---|---|---|
| 9,368,460 B2 | 6/2016 | Yu et al. | |
| 9,372,206 B2 | 6/2016 | Wu et al. | |
| 9,496,189 B2 | 11/2016 | Yu et al. | |
| 9,679,872 B1* | 6/2017 | Wu | H01L 24/13 |
| 9,852,985 B1* | 12/2017 | Lai | H01L 24/06 |
| 2009/0102059 A1* | 4/2009 | Ishii | H01L 23/5226 |
| | | | 257/774 |
| 2010/0258937 A1* | 10/2010 | Shim | H01L 21/768 |
| | | | 257/692 |
| 2012/0153499 A1* | 6/2012 | Byun | H01L 25/105 |
| | | | 257/774 |
| 2016/0005702 A1* | 1/2016 | Shih | H01L 23/3114 |
| | | | 257/737 |
| 2017/0062353 A1* | 3/2017 | Tang | H01L 23/552 |
| 2017/0263588 A1* | 9/2017 | Chen | H01L 25/50 |
| 2017/0271286 A1* | 9/2017 | Kim | H01L 24/05 |

* cited by examiner

PACKAGE STRUCTURE AND METHOD OF FORMING THE SAME

BACKGROUND

The semiconductor industry has experienced rapid growth due to continuous improvements in the integration density of various electronic components (i.e., transistors, diodes, resistors, capacitors, etc.). For the most part, this improvement in integration density has come from continuous reductions in minimum feature size, which allows more of the smaller components to be integrated into a given area. These smaller electronic components also demand smaller packages that utilize less area than previous packages. Some smaller types of packages for semiconductor components include quad flat packages (QFPs), pin grid array (PGA) packages, ball grid array (BGA) packages, flip chips (FC), three-dimensional integrated circuits (3DICs), wafer level packages (WLPs), and package on package (PoP) devices and so on. And the formation of the redistribution circuit structure plays an important role during packaging process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
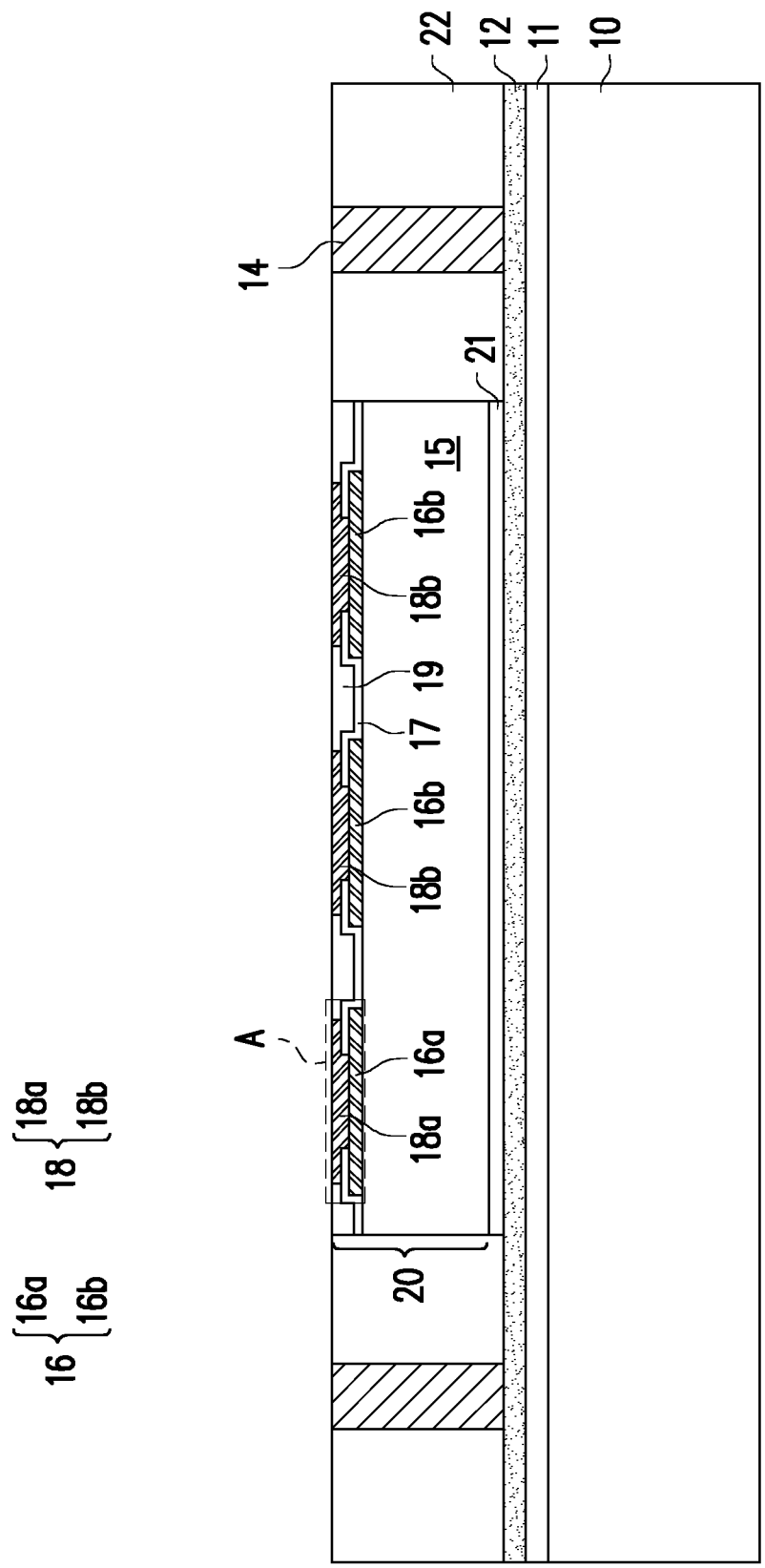
FIG. 1A to FIG. 1D are schematic cross-sectional views illustrating a method of forming a package structure according to a first embodiment of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "above", "upper" and the like, may be used herein for ease of description to describe one element or feature's relationship to another element(s) or feature(s) as illustrated in the FIG.s. The spatially relative terms are intended to encompass different orientations of the device in use or operation in addition to the orientation depicted in the FIG.s. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1D are schematic cross-sectional views illustrating a method of forming a package structure according to a first embodiment of the disclosure. FIG. 2A to FIG. 2N are schematic cross-sectional views illustrating a method of forming a raft-type RDL structure according to the first embodiment of the disclosure.

Figure 2A:
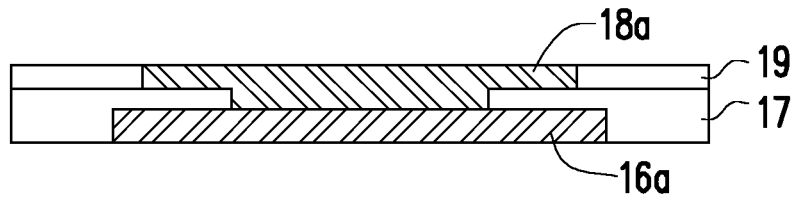
FIG. 2A to FIG. 2N are schematic cross-sectional views illustrating a method of forming a raft-type RDL structure according to the first embodiment of the disclosure.

Referring to FIG. 1A, a carrier 10 is provided. The carrier 10 may be a glass carrier, a ceramic carrier, or the like. A de-bonding layer 11 is formed on the carrier 10 by, for example, a spin coating method. In some embodiments, the de-bonding layer 11 may be formed of an adhesive such as an Ultra-Violet (UV) glue, a Light-to-Heat Conversion (LTHC) glue, or the like, or other types of adhesives. The de-bonding layer 11 is decomposable under the heat of light to thereby release the carrier 10 from the overlying structures that will be formed in subsequent steps.

A dielectric layer 12 is formed on the de-bonding layer 11. In some embodiments, the dielectric layer 12 is a polymer layer. The polymer includes, for example, polyimide, PBO, BCB, Ajinomoto Buildup Film (ABF), Solder Resist film (SR), or the like. The dielectric layer 12 is formed by a suitable fabrication technique such as spin-coating, lamination, deposition, or the like. The dielectric layer 12 is optionally formed, and in some embodiments, the formation of the dielectric layer 12 may be omitted.

A die 20 is attached to the dielectric layer 12 over the carrier 10 through an adhesive layer 21 such as a die attach film (DAF), silver paste, or the like. In some embodiments, the die 20 is one of a plurality of dies cut apart from a wafer, for example. The die 20 may be an application-specific integrated circuit (ASIC) chip, an analog chip, a sensor chip, a wireless and radio frequency chip, a voltage regulator chip or a memory chips. The number of the die 20 shown in FIG. 1A is merely for illustration, and the disclosure is not limited thereto. In some embodiments, two or more dies 20 may be mounted over the carrier 10, and the two or more dies 20 may be the same types of dies or the different types of dies.

Still referring to FIG. 1A, in some embodiments, the die 20 includes a substrate 15, a plurality of pads 16, a passivation layer 17, a plurality of connectors 18 and a passivation layer 19. The pad 16 includes conductive materials such as metal or metal alloy, such as aluminum, copper, nickel, or alloys thereof. The pads 16 may be a part of an interconnection structure (not shown) and electrically connected to the integrated circuit devices (not shown) formed on the substrate 15. The passivation layer 17 is formed over the substrate 15 and covers a portion of the pads 16. A portion of the pads 16 is exposed by the passivation layer 17 and serves as an external connection of the die 20. The connectors 18 are formed on and electrically connected to the pads 16 not covered by the passivation layer 17. The connector 18 includes solder bumps, gold bumps, copper bumps, copper posts, copper pillars, or the like. The passivation layer 19 is formed over the passivation layer 17 and laterally aside the connectors 18 to cover the sidewalls of the connectors 18. The passivation layers 17 and 19 respectively include an insulating material such as silicon oxide, silicon nitride, polymer, or combinations thereof. The polymer includes polybenzoxazole (PBO), polyimide (PI), benzocyclobutene (BCB), combinations thereof or the like. The materials of the passivation layer 17 and the passivation layer 19 may be the same or different. In some embodiments, the top surface of the passivation layer 19 is substantially level with the top surface of the connectors 18.

In some embodiments, the pads 16 includes a plurality of pads 16a and 16b, the connectors 18 includes a plurality of connectors 18a and 18b connected to the pads 16a and 16b, respectively. In some embodiments, the pads 16a and 16b are input/output (I/O) pads of the die 20. The pad 16a and the pad 16b may be different types of I/O pads for different functions. In some embodiments, the pad 16a is a power I/O pad, while the pad 16b is a signal I/O pad, but the disclosure is not limited thereto. The pads 16a and the pads 16b may be electrically isolated from each other. Although one pad 16a and two pads 16b are shown in FIG. 1A, the disclosure is not limited thereto.

In some embodiments, a plurality of through integrated fan-out vias (TIVs) 14 are formed aside or around the die 20. In some embodiments, the TIV 14 includes a seed layer (not shown) and a conductive layer (not shown) formed on the seed layer. The seed layer is, for example, a titanium or/and copper composited layer. The conductive layer is a copper layer, for example. In some embodiments, the sidewalls of the TIV 14 may be straight or inclined. The TIV 14 is optionally formed, and may be formed before or after the die 20 is attached. In some embodiments, the TIVs 14 are formed before the die 20 is attached, and the forming method of the TIVs 14 includes forming a seed layer on the dielectric layer 12 by a sputtering or a suitable technique, a photoresist layer such as a dry film resist is then formed on the seed layer. Thereafter, openings are formed in the photoresist layer to expose a portion of the top surface of the seed layer, and a conductive layer is then formed on the seed layer exposed by the opening by electroplating. Afterwards, the photoresist layer is stripped, and the seed layer not covered by the conductive layer is removed by an etching process with the conductive layer as a mask. The etching process includes isotropic etching process, anisotropic etching process, or a combination thereof. As such, the conductive layer and the seed layer underlying thereof form the TIV 14.

Still referring to FIG. 1A, an encapsulant 22 is formed over the carrier 10 to encapsulate the sidewalls of the die 20 and the TIVs 14. In some embodiments, the encapsulant 22 includes a molding compound, a molding underfill, a resin such as epoxy, combinations thereof, or the like. In some other embodiments, the encapsulant 22 includes a photosensitive material such as polybenzoxazole (PBO), polyimide, benzocyclobutene (BCB), combinations thereof, or the like, which may be easily patterned by exposure and development processes or laser drilling process. In alternative embodiments, the encapsulant 22 includes nitride such as silicon nitride, oxide such as silicon oxide, phosphosilicate glass (PSG), borosilicate glass (BSG), boron-doped phosphosilicate glass (BPSG), combinations thereof, or the like. The encapsulant 22 is formed by forming an encapsulant material layer over the carrier 10 by a suitable fabrication technique such as spin-coating, lamination, deposition, or similar processes. The encapsulant material layer encapsulates the top surfaces and sidewalls of the die 20 and the TIVs 14. Thereafter, a planarization process such as a grinding or polishing process is performed to remove a portion of the encapsulant material layer, such that the top surfaces of the connectors 18a and 18b of the die 20 and the TIVs 14 are exposed. In some embodiments, the top surfaces of the die 20, the TIVs 14 and the encapsulant 22 are substantially coplanar with each other.

Figure 1B:
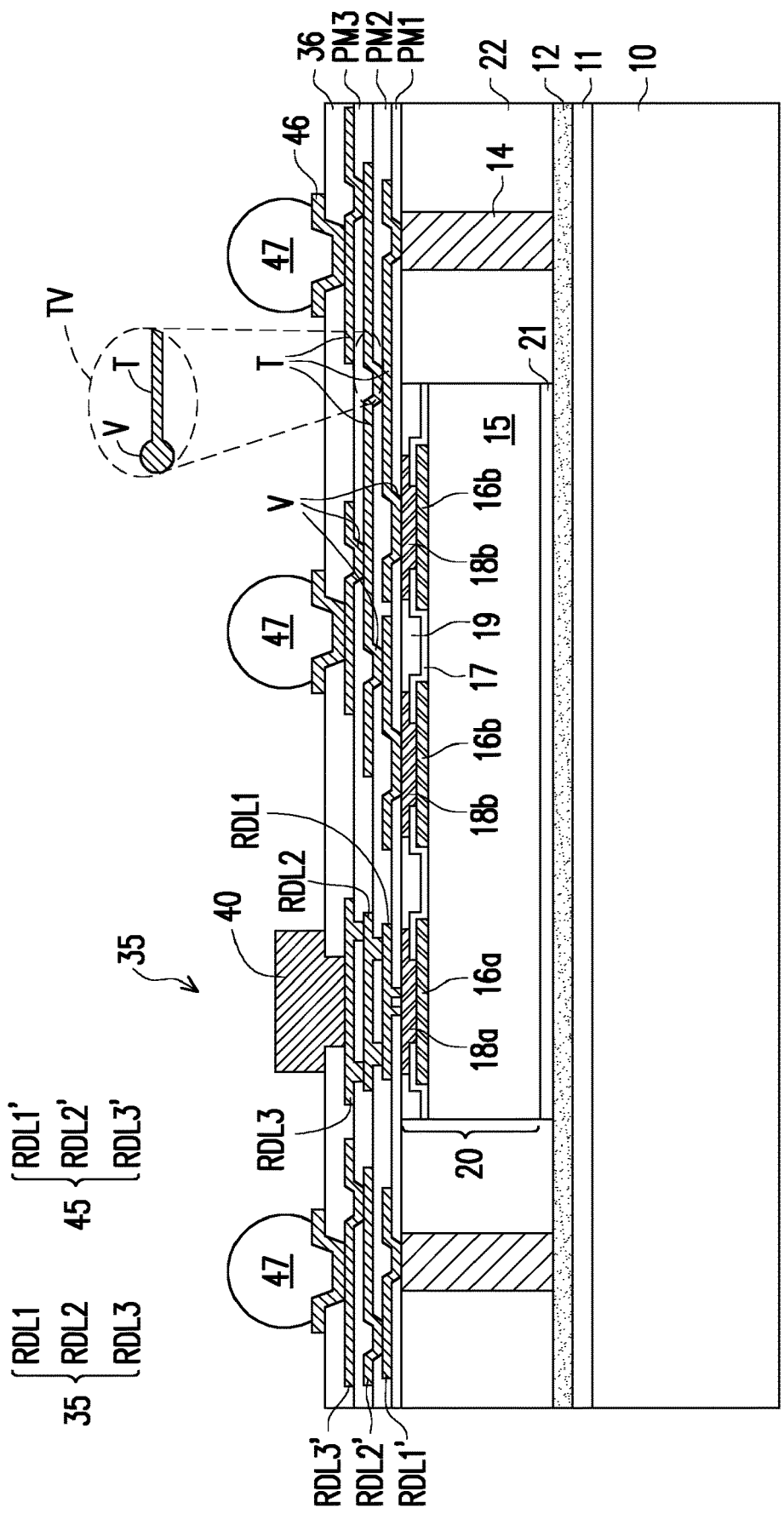

Referring to FIG. 1B, thereafter, polymer layers PM1, PM2, PM3 and redistribution layer (RDL) structures 35 and 45 are formed on the die 20 and the encapsulant 22. In some embodiments, the polymer layers may also be referred to as dielectric layers. The RDL structures 35 and 45 penetrate through the polymer layers PM1, PM2, PM3 to connect to the die 20, respectively. A connector 40 is formed on the RDL structure 35, and connectors 47 are formed on the RDL structure 45. In some embodiments, the RDL structure 35 and the RDL structure 45 are different types of RDL structures. In some embodiments, the RDL structure 35 is a raft-type structure, and the RDL structure 45 is a fan-out RDL structure. The forming method of RDL structure 35 is described in detail as below.

FIG. 2A to FIG. 2N are schematic cross-sectional views illustrating a method of forming the raft-type RDL structure 35 on the structure shown in FIG. 1A according to the first embodiment of the disclosure. For the sake of clarity and brevity, the pad 16a, the connector 18a and portions of the passivation layers 17 and 19 in a region A of FIG. 1A are enlarged shown in FIG. 2A to FIG. 2N, and other components in FIG. 1A are not specifically shown in FIG. 2A to FIG. 2N.

Figure 2B:
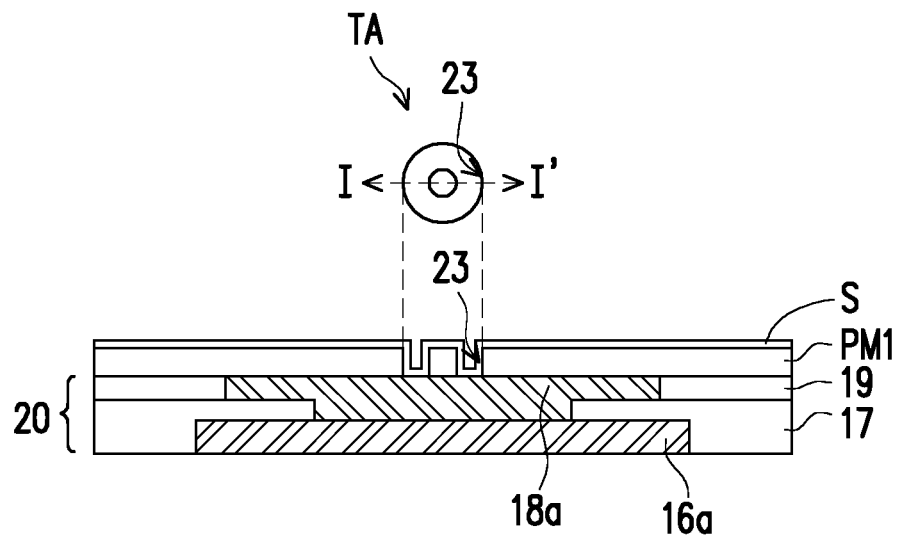

Referring to FIG. 1A, FIG. 2A to FIG. 2B, FIG. 2A is an enlarged view of the region A in FIG. 1A. In some embodiments, after the encapsulant 22 is formed as shown in FIG. 1A, a polymer layer PM1 is formed on the die 20, the TIV 14 and the encapsulant 22 over the carrier 10. In some embodiments, the polymer layer PM1 include a photosensitive material such as polybenzoxazole (PBO), polyimide (PI), benzocyclobutene (BCB), combinations thereof or the like, but the disclosure is not limited thereto. In some other embodiments, the polymer layer PM1 may be replaced by an inorganic dielectric layer. The inorganic dielectric layer may include silicon oxide, silicon nitride, silicon oxynitride, or a combination thereof. The polymer layer PM1 may be formed by a suitable technique such as deposition, lamination, spin coating, or a combination thereof. In some embodiments, the polymer layer PM1 may include a material the same as or different from that of the passivation layer 19. In some embodiments, the passivation layer 19 includes a material similar to the polymer layer PM1 and may be referred as a polymer layer PM0.

Referring to FIG. 2B, the polymer layer PM1 is patterned to form a via hole 23 in the polymer layer PM1. The patterning method includes laser drilling process, photolithography and etching processes, or a combination thereof. The via hole 23 penetrates through the polymer layer PM1 to expose a portion of the top surface of the connector 18a of the die 20. In some embodiments, in the top view TA, the via hole 23 has a ring shape. It is noted that, throughout the description, a ring shape may include a circular ring shape, oval ring shape, or other kind of ring shape, or the like. The cross sectional shape of the via hole 23 along a I-I' line of the top view TA may be square(s), rectangle(s), trapezoid(s), or the like, but the disclosure is not limited thereto.

In some embodiments, a seed layer S is then formed on the polymer layer PM1 by a sputtering process, for example. The seed layer S may be a metal seed layer such as a copper seed layer. In some embodiments, the seed layer S includes a first metal layer such as a titanium layer and a second metal layer such as a copper layer over the first metal layer. In some embodiments, the seed layer S is conformal with the polymer layer PM1. The seed layer S covers the top surface of the polymer layer PM1, and filling into the via hole 23 to cover the inner surface of the via hole 23. The seed layer S is in electrical contact with the connector 18a exposed by the via hole 23.

Figure 2C:
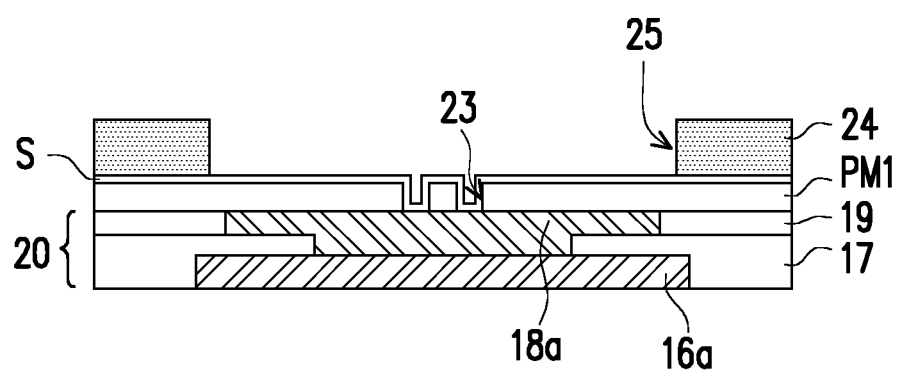

Referring to FIG. 2C, a mask layer 24 having an opening 25 is formed on the seed layer S. The mask layer 24 is, for instance, a patterned photoresist. The opening 25 is overlapped with and in spatial communication with the via hole 23, exposing a portion of the seed layer S on the polymer layer PM1 and the seed layer S in the via hole 23. In some embodiments, the shape of the opening 25 in top view may be circular, oval, or the like, and the opening 25 is coaxially aligned with the ring-shaped via hole 23, but the disclosure is not limited thereto.

Figure 2D:
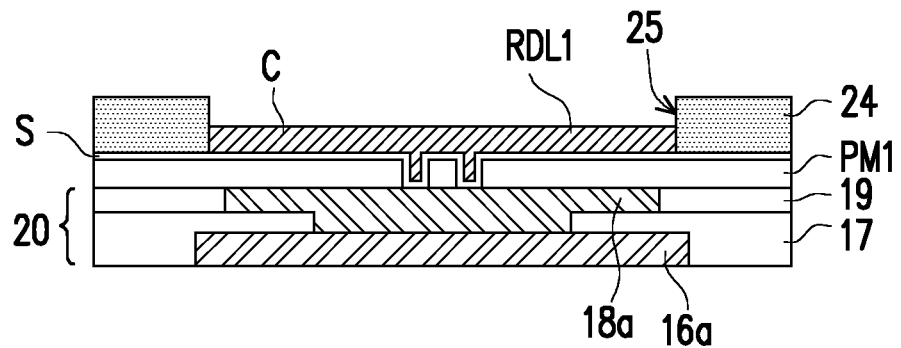
Figure 2E:
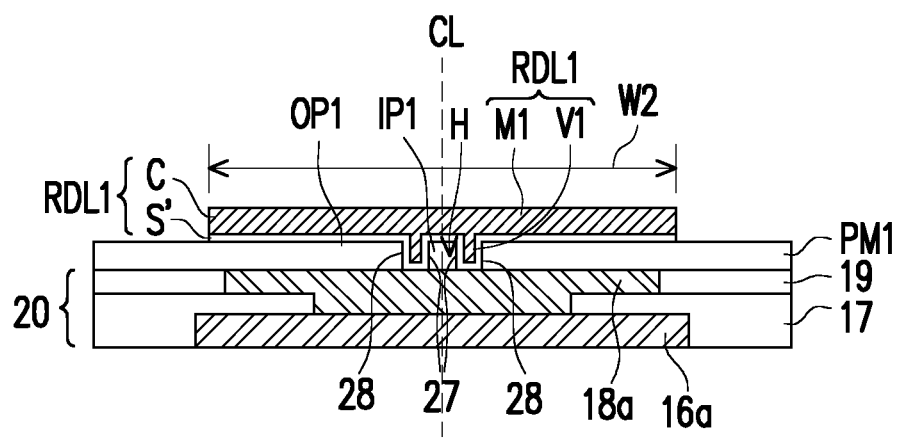

Referring to FIG. 2D and FIG. 2E, a conductive layer C is formed on the seed layer S exposed by the mask layer 24 through, for example, electroplating, or electroless plating. The conductive layer C may be copper or other suitable metals.

In some embodiments, thereafter, the mask layer 24 is removed by an ashing process, for example, and the seed layer S not covered by the conductive layer C is removed by an etching process with the conductive layer as a mask, and a seed layer S' is remained. The etching process may include isotropic etching process, anisotropic etching process, or a combination thereof. The seed layer S' is extending on the top surface of the polymer layer PM1 and the inner surface of the via hole 23 (FIG. 2B). The conductive layer C is over the polymer layer PM1 and fills into the via hole 23 not filled by the seed layer S' to cover the seed layer S'. Thus, the conductive layer C and the seed layer S' underlying thereof form a redistribution layer RDL1. The redistribution layer RDL1 is located on the connector 18a and the polymer layer PM1, and penetrates through the polymer layer PM1 to connect to the connector 18a of the die 20.

Referring to FIG. 2E, in some embodiments, the seed layer S' and the conductive layer C in the via hole 23 (FIG. 2B) form a via V1 of the redistribution layer RDL1, the seed layer S' and the conductive layer C on the polymer layer PM1 and on the via V1 form a conductive plate M1 of the redistribution layer RDL1. In other words, the redistribution layer RDL1 includes the via V1 and the conductive plate M1 electrically connected to each other. The via V1 is located in the via hole 23 (FIG. 2B) in the polymer layer PM1 and penetrates through the polymer layer PM1 to be in electrical contact with the connector 18a of the die 20. In some embodiments, the top surface of the via V1 is substantially level with the top surface of the polymer layer PM1. The conductive plate M1 is located on the via V1 and the polymer layer PM1, and is electrically connected to die 20 through the via V1.

Figure 4A:
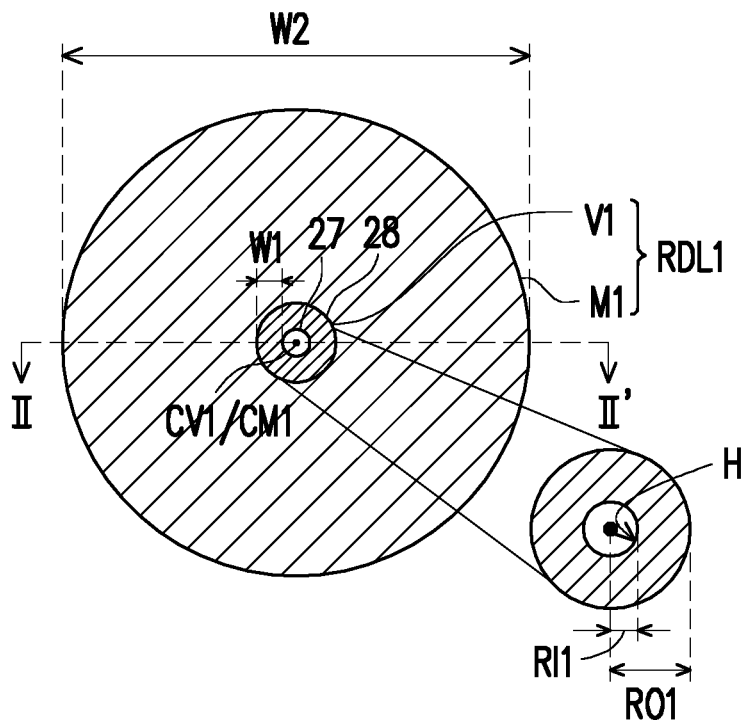
FIG. 4A is a top view illustrating a via and a conductive plate of a raft-type RDL structure according to the first embodiment of the disclosure.

FIG. 4A is a top view of the redistribution layer RDL1 according to some embodiments of the disclosure. The cross-sectional view of the redistribution layer RDL1 shown in FIG. 2E is taken along an II-II' line of FIG. 4A.

Referring to FIG. 2E and FIG. 4A, in some embodiments, the via V1 has a shape of hollow cylinder, such as a circular hollow cylinder, oval hollow cylinder or other kind of hollow cylinder, but the disclosure is not limited thereto. In some embodiments, the via V1 is donut shaped, ring-shaped or the like. In some embodiments, the via V1 may also be referred to as a curved line or a curved conductive line. The top view of the via V1 is ring-shaped, or the like. It is noted that, the ring-shape used herein is not limited to circular ring shape. The ring-shape may be a circular ring, an oval ring, or other kind of ring. The cross-section shape of the via V1 along II-II' line of FIG. 4A may be two squares, two rectangles, two trapezoids, or the like. The via V1 includes an inner sidewall 27 and an outer sidewall 28. The inner sidewall 27 and the outer sidewall 28 may be straight, inclined, or arced. In some embodiments, the top views of the inner sidewall 27 and outer sidewall 28 are circular. The radius of the inner sidewall 27 is less than the radius of the outer sidewall 28. That is, the inner radius RI1 of the via V1 is less than the outer radius RO1 of the via V1. The ring width W1 of the via V1 is defined as the difference between the outer radius RO1 and the inner radius RI1. In other words, the ring width W1 of the via V1 may be calculated by the equation: W1=RO1-RI1. In some embodiments, the ring width W1 ranges from about 5 μm to about 20 μm, such as about 10 μm.

In some embodiments, the via V1 is sandwiched between two portions of the polymer layer PM1. In detail, the polymer layer PM1 includes a first portion IP1 and a second portion OP1. The first portion IP1 may be referred to the polymer layer PM1 inside the ring of the via V1, and is in physical contact with the inner sidewall 27 of the via V1. The second portion OP1 may be referred to the polymer layer PM1 outside the ring of the via V1, and is in physical contact with the outer sidewall 28 of the via V1. The first portion IP1 of the polymer layer PM1 is enclosed by the inner sidewall 27 of the via V1 and is separated from the second portion OP1 of the polymer layer PM1. In some embodiments, the first portion IP1 of the polymer layer PM1 and the second portion OP1 of the polymer layer PM1 are completely separated from each other by the via V1 therebetween. In other word, in some embodiments, the via V1 is an enclosed ring having a hole H (FIG. 4A) therein, and the first portion IP1 of the polymer layer PM1 is filled in the hole H of the via V1.

Figure 4B:
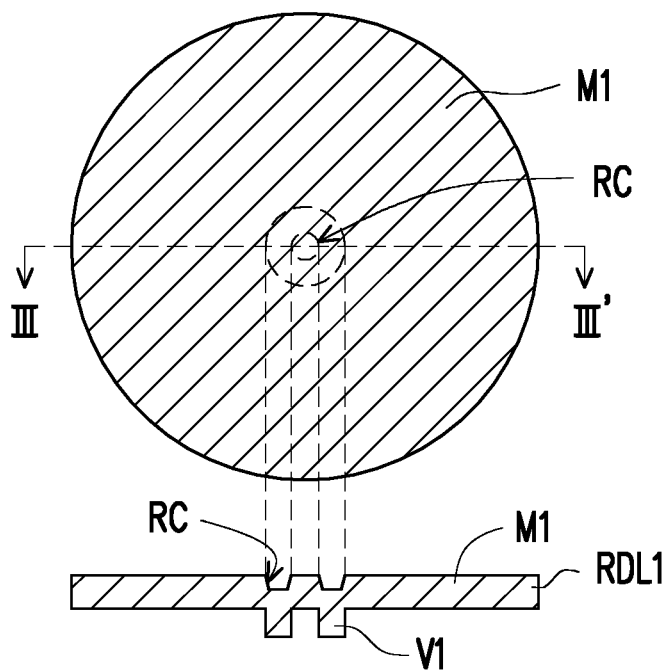
FIG. 4B is a top view of a conductive plate of a raft-type RDL structure correspond to a cross-sectional view along an line thereof according to the first embodiment of the disclosure.

Still referring to FIG. 2E and FIG. 4A, in some embodiments, the conductive plate M1 is disc shaped such as circular disc shaped, dish shaped such as circular dish shaped, or the like, but the disclosure is not limited thereto. The width W2 of the conductive plate M1 ranges from about 75 μm to about 135 μm, for example. In some embodiments in which the conductive plate M1 is circular disc shaped, the width W2 of the conductive plate M1 refers to the diameter thereof. In some embodiments, the conductive plate M1 has a substantial flat top surface, but the disclosure is not limited thereto. Referring to FIG. 4B, in some embodiments, the conductive plate M1 has a recess RC directly over the via V1. The recess RC is ring-shaped, for example.

In some embodiments, the via V1 and the conductive plate M1 are coaxial, that is, when viewed in the cross-sectional view FIG. 2E, a center line CL of the via V1 and a center line CL of the conductive plate M1 perpendicular to the top surface of the die 20 are aligned with each other. In some embodiments, both the conductive plate M1 and the via V1 are symmetrical with respect to the center line CL, but the disclosure is not limited thereto. When view in the top view FIG. 4A, a center point CV1 of the via V1 and a center point CM1 of the conductive plate M1 are aligned with each other in a direction perpendicular to the top surface of the die 20. It is noted that, the center point CV1 of the via V1 refers to the center of the ring of the via V1. In some embodiments, in the redistribution layer RDL1, the number of the via V1 equal to the number of the conductive plate M1, such as one via V1 correspond to one conductive plate M1. In some embodiments, the redistribution layer RDL1 includes only one via V1 and only one conductive plate M1.

Figure 2F:
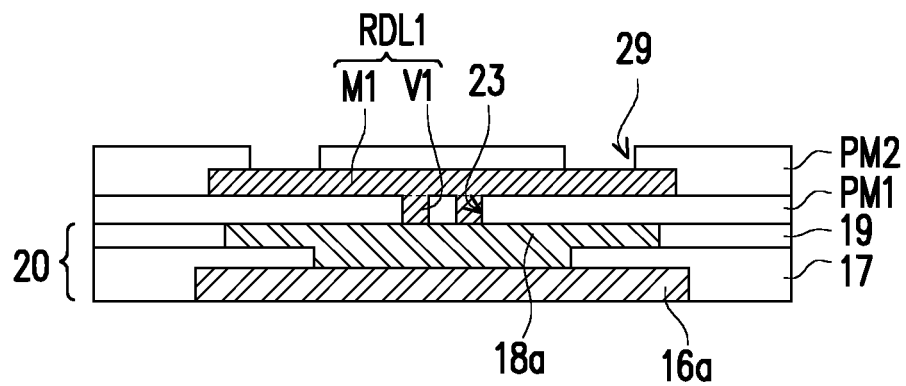
Figure 2G:
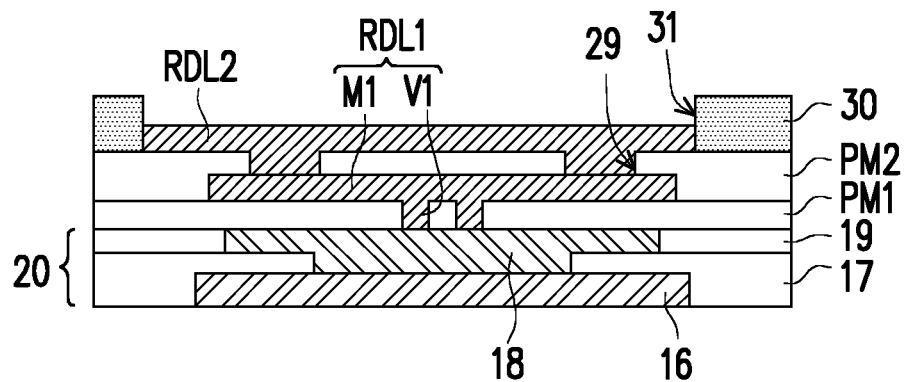
Figure 2H:
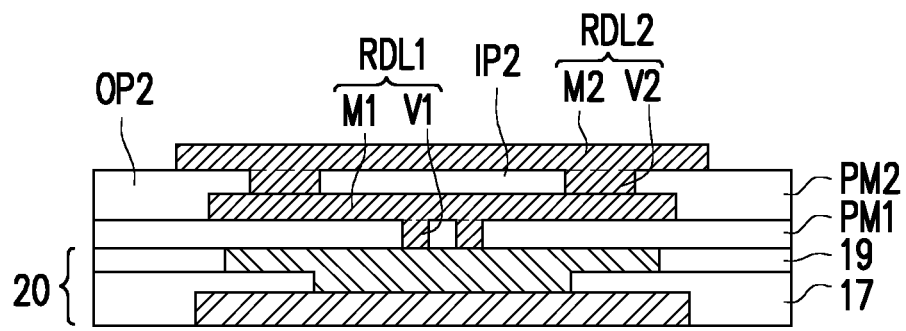

Referring to FIG. 2F to FIG. 2H, processes similar to FIG. 2B to FIG. 2E are performed to form a polymer layer PM2 and a redistribution layer RDL2 on the polymer layer PM1 and the redistribution layer RDL1. The materials and the forming methods of the polymer layer PM2 and the redistribution layer RDL2 are similar to, the same as or different from those of the polymer layer PM1 and the redistribution layer RDL1, respectively. It is noted that, for the sake of brevity, the seed layer S' and the conductive layer C of the redistribution layer RDL1 are not specifically shown in the following figures.

Referring to FIG. 2F, a polymer layer PM2 is formed on the polymer layer PM1 and the redistribution layer RDL1. Thereafter, the polymer layer PM2 is patterned, and a via hole 29 is formed in the polymer layer PM2 to expose a portion of the top surface of the conductive plate M1. In some embodiments, the via hole 29 and the via hole 23 (FIG. 2C) have similar shape in different sizes, but the disclosure is not limited thereto. The shape and the size of the via hole 29 may be the same as or different from those of the via hole 23 (FIG. 2B). In some embodiments, the via hole 29 and the via hole 23 are coaxial, and are staggered. In some embodiments, the size (such as, width, inner radius or outer radius) of the via hole 29 is larger than the size of the via hole 23.

Referring to FIG. 2G and FIG. 2H, a mask layer 30 having an opening 31 is formed on the polymer layer PM2. The opening 31 is overlapped with the via hole 29, exposing a portion of the polymer layer PM2 and the top surface of the conductive plate M1 exposed in the via hole 29. The redistribution layer RDL2 is then formed in the opening 31 and the via hole 29 and is electrically connected to the redistribution layer RDL1. Thereafter, the mask layer 30 is removed. It is noted that, in some embodiments, the formation of the redistribution layer RDL2 also includes forming a seed layer and a conductive layer which is similar to the formation of the redistribution layer RDL1, and are not shown and described again for the sake of brevity.

Referring to FIG. 2H, the redistribution layer RDL2 includes a via V2 and a conductive plate M2 on the via V2. The via V2 is located in and penetrating through the polymer layer PM2 to be in electrical contact with the top surface of the conductive plate M1 of the redistribution layer RDL1. The conductive plate M2 is located on the via V2 and the polymer layer PM2, and is electrically connected to the redistribution layer RDL1 through the via V2. The structural feature of the redistribution layer RDL2 is similar to that of the redistribution layer RDL1 as described in FIGS. 2E, 4A and 4B, and is not described again here. The shape and the size of the redistribution layer RDL2 may be the same as or different from those of the redistribution layer RDL1. Similar to the polymer layer PM1, the polymer layer PM2 includes a first portion IP2 inside the inner sidewall of the via V2 and a second portion OP2 outside the outer sidewall of the via V2. The first portion IP2 is enclosed by the via V2. The first portion IP2 and the second portion OP2 of the polymer layer PM2 are separated or completely separated from each other by the via V2 therebetween.

Figure 2I:
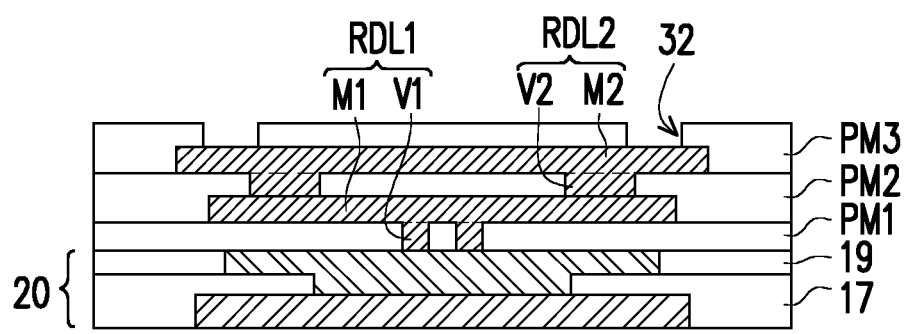
Figure 2J:
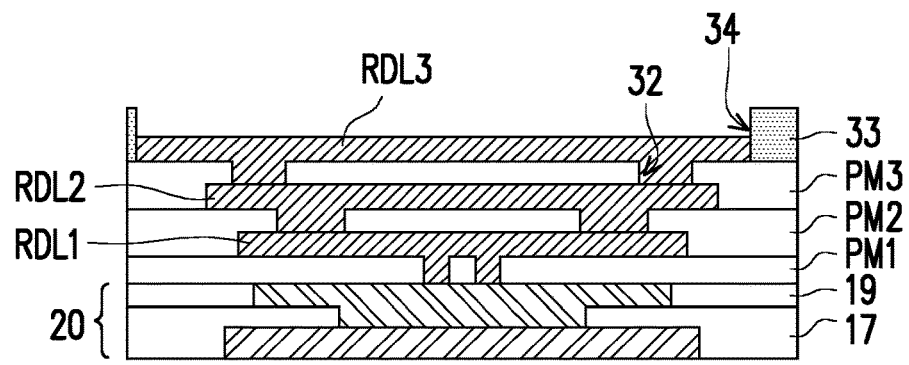
Figure 2K:
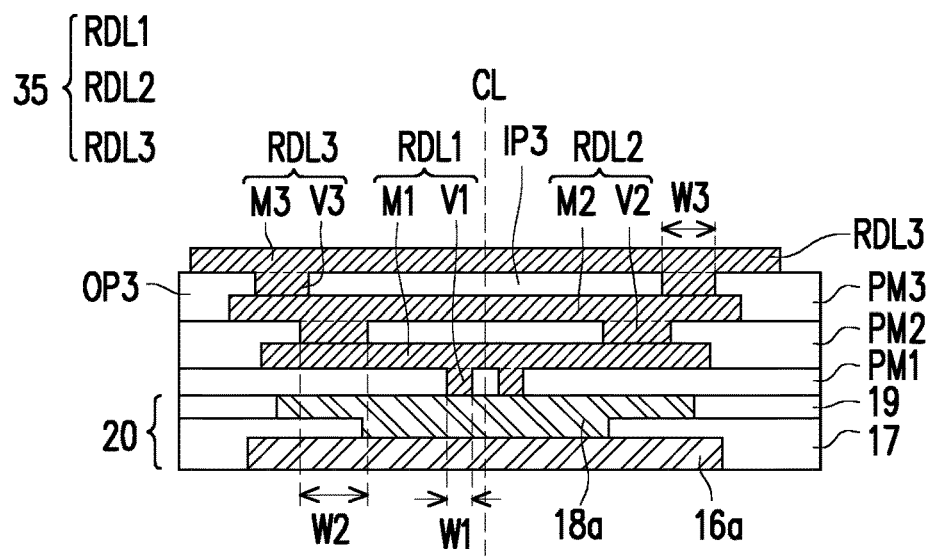

Referring to FIG. 2I to FIG. 2K, processes similar to FIG. 2B to FIG. 2E are performed to form a polymer layer PM3 and a redistribution layer RDL3 on the polymer layer PM2 and the redistribution layer RDL2. The materials and the forming methods of the polymer layer PM3 and the redistribution layer RDL3 are similar to, the same as or different from those of the polymer layer PM1 and the redistribution layer RDL1 or the polymer layer PM2 and the redistribution layer RDL2, respectively.

Referring to FIG. 2I, a polymer layer PM3 is formed on the polymer layer PM2 and the redistribution layer RDL2. Thereafter, the polymer layer PM3 is patterned, and a via hole 32 is formed in the polymer layer PM3 to expose a portion of the top surface of the conductive plate M2 of the redistribution layer RDL2. In some embodiments, the via hole 32 is ring-shaped, for example. The size (such as, width, inner radius, or outer radius) of the via hole 32 may be less than, equal to, or larger than that of the via hole 29 and the via hole 23, respectively.

Referring to FIG. 2J and FIG. 2K, a mask layer 33 having an opening 34 is formed on the polymer layer PM3. The opening 34 is overlapped with the via hole 32, exposing a portion of the polymer layer PM3 and the top surface of the conductive plate M2 exposed in the via hole 32. The redistribution layer RDL3 is then formed in the opening 34 and the via hole 32 and is electrically connected to the redistribution layer RDL2. Thereafter, the mask layer 33 is removed.

Referring to FIG. 2K, the redistribution layer RDL3 includes a via V3 and a conductive plate M3 on the via V3. The via V3 is located in and penetrating through the polymer layer PM3 to be in electrical contact with the top surface of the conductive plate M2 of the redistribution layer RDL2. The conductive plate M3 is located on the via V3 and the polymer layer PM3, and is electrically connected to the redistribution layer RDL2 through the via V3. The structure feature of the redistribution layer RDL 3 is similar to that of the redistribution layer RDL1 or RDL2, and is not described again here. Similar to the polymer layer PM1 and the polymer layer PM2, the polymer layer PM3 includes a first portion IP3 inside the inner sidewall of the via V3 and a second portion OP3 outside the outer sidewall of the via V3.

The first portion IP3 is enclosed by the via V3. The first portion IP3 and the second portion OP3 of the polymer layer PM2 are separated or completely separated from each other by the via V2 therebetween.

Referring to FIG. 2K, in some embodiments, the redistribution layers RDL1, RDL2, RDL3 form the RDL structure 35 located in and on the polymer layers PM1, PM2, PM3. In some embodiments, the RDL structure 35 is referred to as a raft-type RDL structure formed directly over the die 20.

Figure 2L:
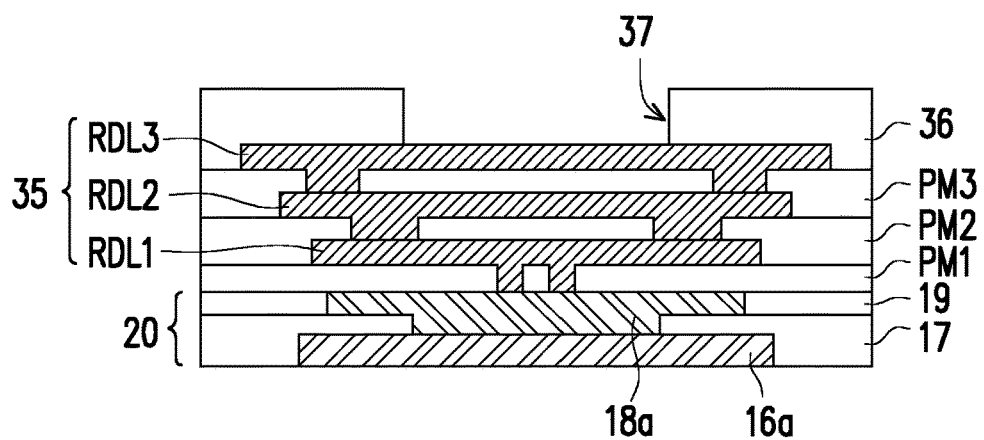
Figure 2M:
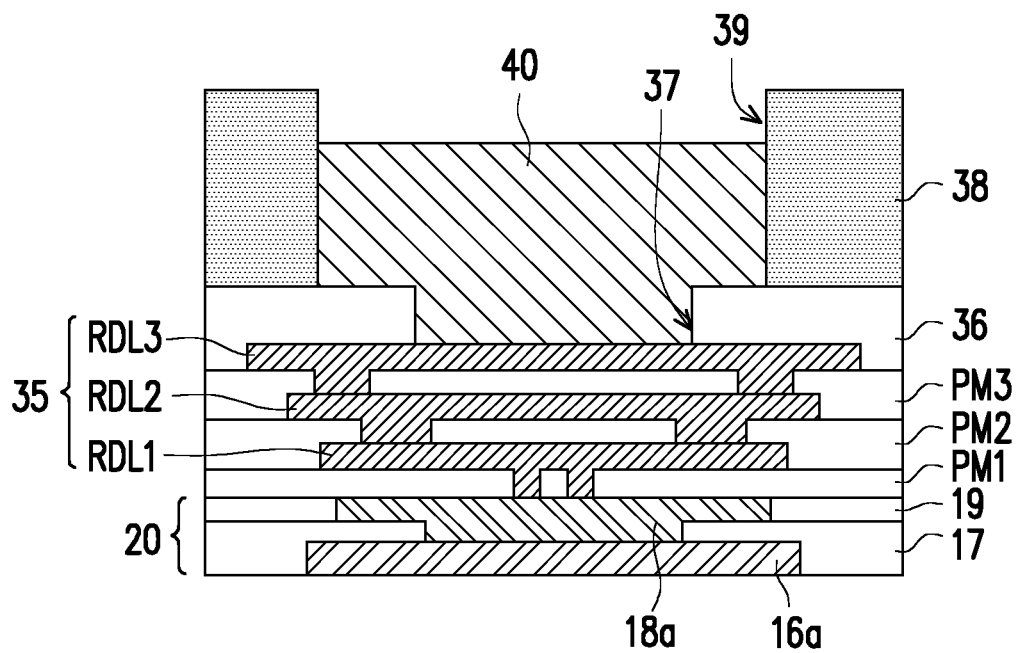
Figure 2N:
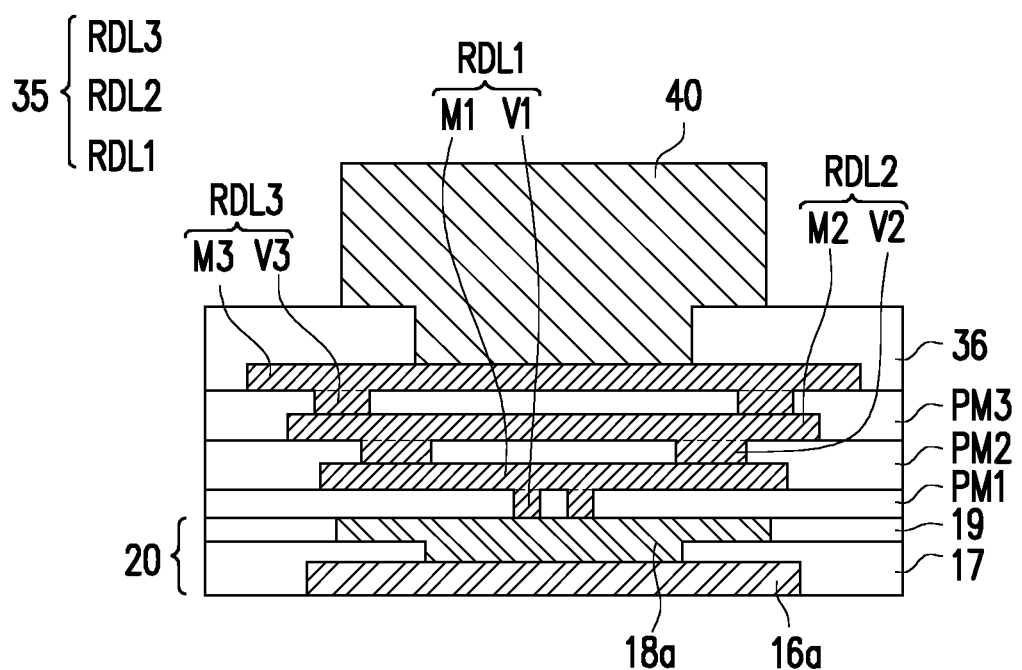

Referring to FIG. 2L to FIG. 2N, a connector 40 is then formed on the RDL structure 35. In some embodiments, the connector 40 is formed by the following processes: a protection layer 36 is formed on the RDL structure 35 and the polymer layers PM1, PM2, PM3. In some embodiments, the protection layer 36 is a polymer layer, and includes a material the same as or different from those of the polymer layers PM1, PM2 or PM3. In some other embodiments, the protection layer 36 may include inorganic material such as silicon oxide, silicon nitride, silicon oxynitride or combinations thereof. The protection layer 36 may be formed by a suitable technique such as deposition, spin coating, lamination or a combination thereof. Thereafter, a window 37 is formed in the protection layer 36. The window 37 exposes a portion of the redistribution layer RDL3 of the RDL structure 35. In some embodiments, the method of forming the window 37 includes laser drilling process, exposure and development processes, photolithography and etching processes, or a combination thereof.

Referring to FIG. 2M and FIG. 2N, a mask layer 38 is formed on the protection layer 36. The mask layer 38 has an opening 39 which is overlapped with the window 37. Thereafter, the connector 40 is formed on the redistribution layer RDL3 of the RDL structure 35 and the protection layer 36 exposed by the window 37 and the opening 39. The material of the connector 40 includes copper, aluminum, lead-free alloys (e.g., gold, tin, silver, aluminum, or copper alloys) or lead alloys (e.g., lead-tin alloys). In some embodiments, the connector 40 is a conductive bump, and a solder ball (not shown) may further be formed on the conductive bump by a ball mounting process, for example. In some embodiments, the connector 40 may be controlled collapse chip connection (i.e. C4) bump formed by a C4 process. In some other embodiments, the connector 40 may be a solder ball and may be formed by a ball mounting process. The ball mounting process may include a ball placement process and reflow process. In some embodiments, the connector 40 is referred to as a conductive terminal.

Referring to FIG. 2N, the connectors 40 is electrically connected to the die 20 through the RDL structure 35. In some embodiments, the RDL structure 35 is referred to as a raft-type structure formed in a region directly over the die 20. The structural features of the RDL structure 35 will be described in detail as below.

Figure 3A:
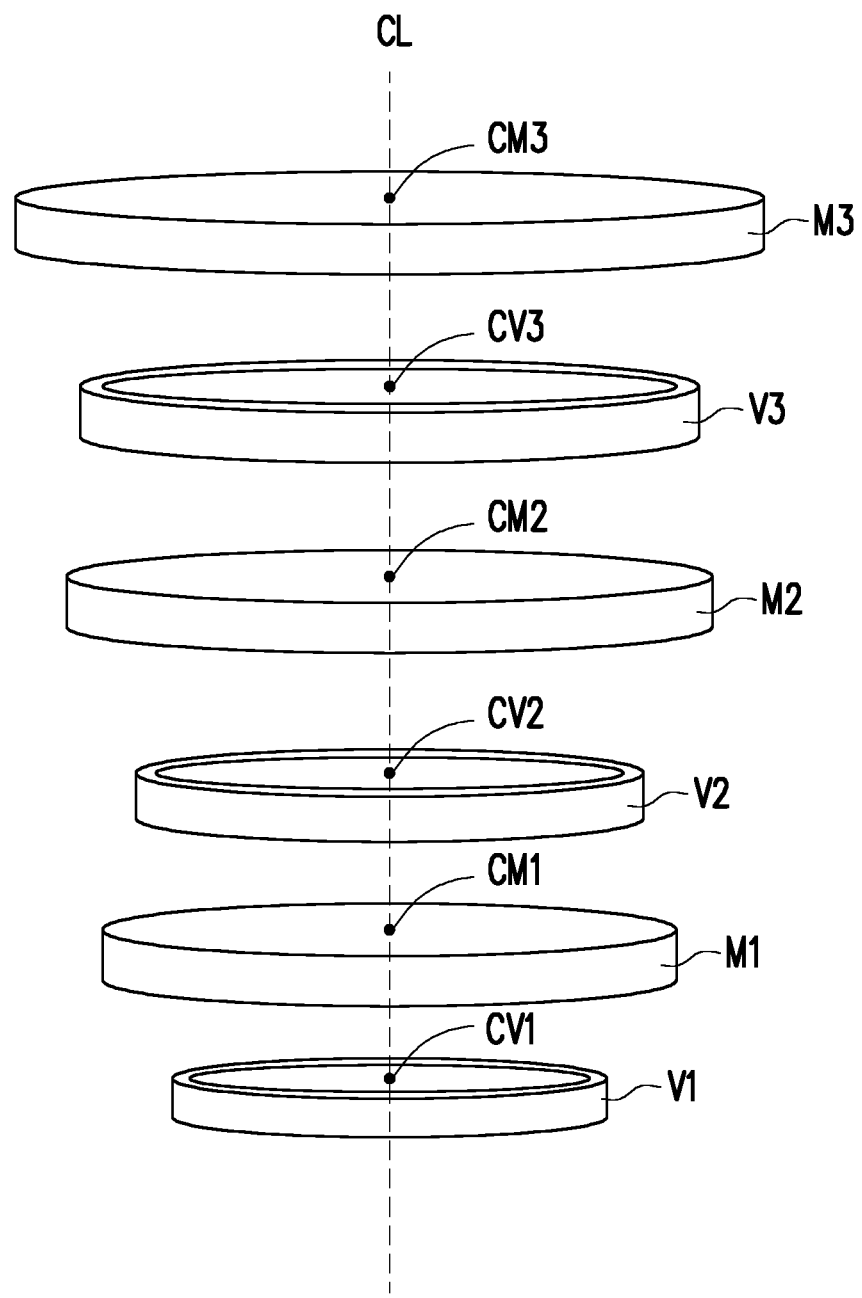
FIG. 3A to FIG. 3B are perspective views respectively illustrating a raft-type RDL structure according to the first embodiment of the disclosure.

FIG. 3A is a perspective view the RDL structure 35 according to some embodiments of the disclosure. It is noted that, the vias V1, V2, V3 and the conductive plates M1, M2, M3 in FIG. 3A are shown as separated for the ease of illustration. But it is understood that the vias V1, V2, V3 and the conductive plates M1, M2, M3 are connected to each other.

Referring to FIG. 2K and FIG. 3A, in some embodiments, the RDL structure 35 includes the redistribution layers RDL1, RDL2, RDL3 stacked on the connector 18a of the die 20. The redistribution layer RDL1 penetrates through the polymer layer PM1 to be in electrical contact with the connector 18a of the die 20. The redistribution layer RDL2 penetrates through the polymer layer PM2 to be in electrical contact with the redistribution layer RDL1. The redistribution layer RDL3 penetrates through the polymer layer PM3 to be in electrical contact with the redistribution layer RLD2. The number of the layers of the redistribution layers shown in FIG. 2K and FIG. 3A is merely for illustration, and the disclosure is not limited thereto.

In some embodiments, the redistribution layer RDL1 includes the via V1 and the conductive plate M1 on the via V1. The redistribution layer RDL2 includes the via V2 and the conductive plate M2 on the via V2. The redistribution layer RDL3 includes the via V3 and the conductive plate M3 on the via V3. The via V1 is located in the polymer layer PM1 and electrically connect the conductive plate M1 to the die 20. The via V2 is located in the polymer layer PM2 to connect the conductive plate M2 to the conductive plate M1. The via V3 is located in the polymer layer PM3 to connect the conductive plate M3 to the conductive plate M2.

In some embodiments, in each redistribution layer RDL1, RDL2, RDL3 of the RDL structure 35, the number of the via is equal to the number of the conductive plate, such as one via correspond to one conductive plate. For example, the redistribution layer RDL1 includes or is consist of only one via V1 and only one conductive plate M1, the redistribution layer RDL2 includes or is consist of only one via V2 and only one conductive plate M2, the redistribution layer RDL3 includes or is consist of only one via V3 and only one conductive plate M3. However, the disclosure is not limited thereto.

In some embodiments, the top surfaces of the vias V1, V2, V3 are substantially coplanar with the top surface of the polymer layers PM1, PM2, PM3, respectively. In some embodiments, the top surfaces of the conductive plates M1, M2, M3 are substantially flat, but the disclosure is not limited thereto. In some other embodiments, each of the conductive plates M1, M2, M3 may have a recess directly over the V1, V2, V3, respectively, as illustrated in the description of conductive plate M1 shown in FIG. 2E and FIG. 4B.

In some embodiments, the vias V1, V2, V3 of redistribution layers RDL1, RDL2, RDL3 have similar shapes with different sizes, but the disclosure is not limited thereto. The shapes and the sizes of the vias V1, V2, V3 may be the same or different. In some embodiments, the conductive plates M1, M2, M3 of the redistribution layers RDL1, RDL2, RDL3 have similar shapes with different sizes, but the disclosure is not limited thereto. The shapes and the sizes of the conductive plates M1, M2, M3 may be the same or different.

In some embodiments, the vias V1, V2, V3 may be hollow cylinder shaped, donut shaped, ring-shaped, or the like. The conductive plates M1, M2, M3 may be disc shaped, dish shaped, or the like. The conductive plates M1, M2, M3 are solid instead of hollow. In some embodiments, the respective contact area between the via V1, V2, V3 and the corresponding conductive plate M1, M2, M3 ranges from about 150 $\mu m^2$ to about 2600 for example. The respective ratio of the top surface area of the via V1, V2, V3 (that is, the contact area between the via and the conductive plate) to the bottom surface area of the conductive plate M1, M2, M3 ranges from about 0.01 to about 0.6, for example. In some embodiments, with the ratio in this range, the contact area between the respective via and conductive plate is large enough to avoid the crack issue of RDL structure when subject to temperature loading (such as the high temperature of reflow process). In addition, the stress of the via or conductive plate of the RDL structure may be controlled in a suitable range.

In some embodiments, the vias V1, V2, V3 and the conductive plates M1, M2, M3 are coaxial, that is to say, center lines CL of the vias V1, V2, V3 and the conductive plates M1, M2, M3 are aligned with each other in a direction parallel with a normal line of the die 20. In other words, the center points CV1/CM1/CV2/CM2/CV3/CM3 thereof are aligned with each other in the direction perpendicular to the top surface of the die 20, but the disclosure is not limited thereto. It is noted that the center points of the vias V1, V2, V3 refer to the center points of the rings. In some embodiments, as shown in FIG. 2K, each of the vias V1, V2, V3 and the conductive plates M1, M2, M3 are symmetrical with respect to the center line CL, but the disclosure is not limited thereto. In each of the redistribution layers RDL1, RDL2, RDL3, the area of the conductive plate is larger than the area of the via, that is, the via is located in a region within the corresponding conductive plate, in other words, all of the vias V1, V2, V3 are located within the region of the largest conductive plate.

Figure 5A:
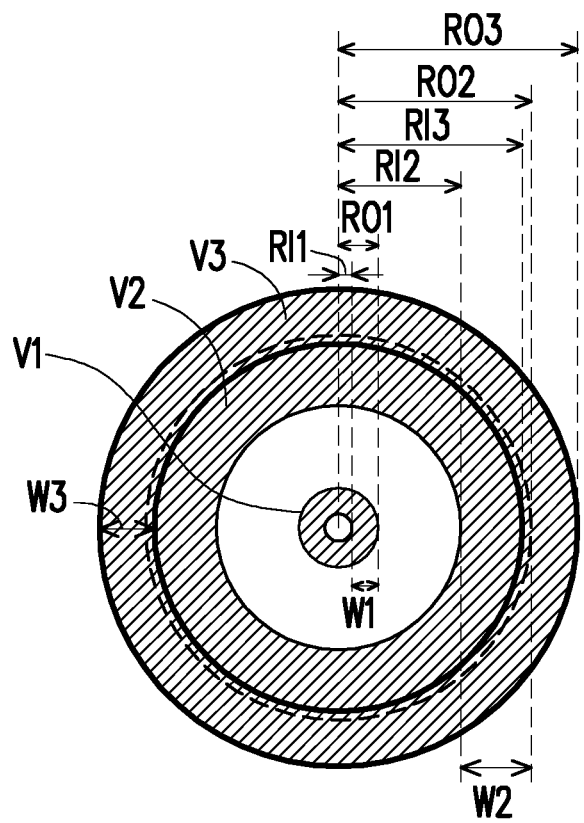
FIG. 5A to FIG. 5C are top views respectively illustrating vias of a raft-type RDL structure according to the first embodiment of the disclosure.
Figure 5B:
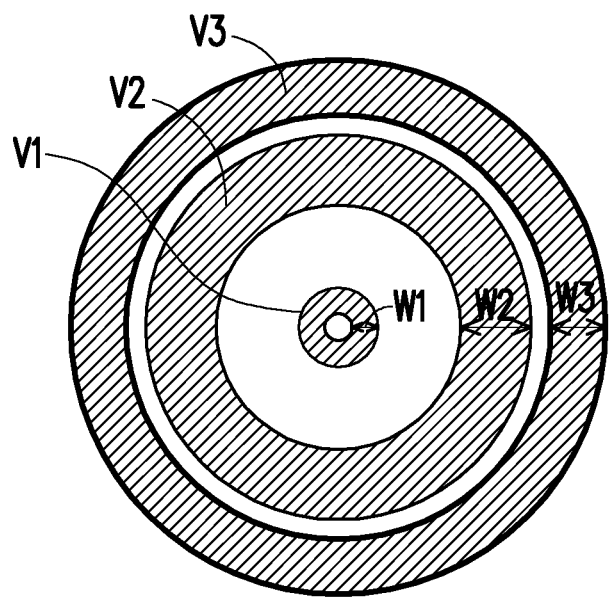

Referring to FIG. 2K, FIG. 3A, FIG. 5A and FIG. 5B, in some embodiments, the vias V1, V2, V3 may be stagger with each other or partially overlapped with each other when projected to the top surface of the die 20. For example, as shown in FIG. 5A, the via V1 is staggered with the vias V2 and V3. The via V2 and the via V3 may be partially overlapped. As shown in FIG. 5B, the vias V1, V2, V3 are all staggered with each other. However, the disclosure is not limited thereto, some of or all of the vias V1, V2, V3 may be staggered, overlapped, or partially overlapped.

Referring to FIG. 5A and FIG. 5B, in some embodiments, the inner radius RI2 of the via V2 is larger than the outer radius RO1 of the via V1. The inner radius RI3 of the via V3 may be slightly less than, the same as or larger than the outer radius RO2 of the via V2, and the outer radius RO3 is larger than the outer radius RO2 of the via V2, but the disclosure is not limited thereto. The ring widths W1, W2, W3 of the vias V1, V2, V3 may be the same or different. In some embodiments, the ring widths W2 of the via V2 is larger than the ring width W1 of the via V1 and the ring width W3 of the via V3, and the ring width W3 of the via V3 is larger than the ring width W1 of the via V1, but the disclosure is not limited thereto. In some embodiments, the ring widths W1, W2, W3 of the vias V1, V2, V3 are increased progressively from bottom to top. It is noted that, the inner radius of the via refer to the radius of the inner sidewall of the ring-shaped via, and the outer radius of the via refer to the radius of the outer sidewall of the ring-shaped via. The ring width of each via refers to the difference value between inner radius and the outer radius thereof.

Figure 5C:
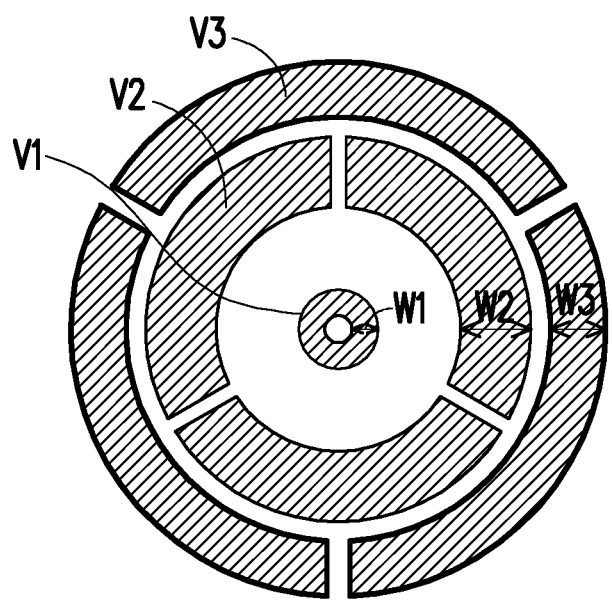

Although the vias V1, V2, V3 are shown as enclosed ring shaped, but the disclosure is not limited thereto. Referring to FIG. 5C, in some embodiments, at least one of the vias V1, V2, V3 is enclosed ring shaped, and some of the vias V1, V2, V3 are not enclosed ring shaped. For example, some of the vias V1, V2, V3 may be non-enclosed ring shaped, or comprised of a plurality of small vias arranged in a ring. In some embodiments, the via where the stress is large (such as, the bottommost via V1) is enclosed ring shaped, and is staggered with other vias V2 and V3 when projected to the top surface of the die 20, while the via where the stress is relatively small (such as via V2 or V3) is not enclosed ring shaped, but may be non-enclosed ring shaped or comprised of a plurality of small vias, and the vias where the stress is relatively small may be staggered, overlapped, or partially overlapped with each other.

Referring to FIG. 2K, FIG. 3A, the diameters of the conductive plates M1, M2, M3 may be the same as or different from each other. In some embodiments, the diameter of the conductive plates M1, M2, M3 are increased progressively from bottom to top, but the disclosure is not limited thereto. In some embodiment, the sizes (such as, width, inner or outer radius) of the vias V1, V2, V3 and the sizes (such as diameter) of the conductive plates M1, M2, M3 are correspond to the size (such as width or diameter) of the connector 18a of the die 20. In some embodiments, the diameters (or widths) of the conductive plates M1, M2, M3 are larger than the diameter (or width) of the connector 18a of the die 20. In an embodiment, the diameter of the connector 18a is about 75 μm, the diameters of the conductive plate M1, M2, M3 are about 85 μm, about 100 μm, about 135 μm, respectively.

In some embodiments, in the raft-type RDL structure 35, the vias are ring-shaped, and the conductive plates are disk shaped. Therefore, the contact area between the vias and the conductive plates are increased, the strength of the via and the conductive plate are thus enhanced. When subjected to temperature loading (such as the high temperature of reflow process), the vias of the raft-type RDL structure 35 having the structure described above has an enhanced-strength and may reduce RDL strain and polymer layer stress. Therefore, the structure of the raft-type RDL structure 35 may avoid the redistribution layers of the raft-type RDL structure 35 from cracking, and the issue of delamination between the redistribution layer and the polymer layer may also be avoided.

Referring back to FIG. 1B, in some embodiments, during the formation of the raft-type RDL structure 35 and the connector 40, the RDL structure 45 and the plurality of connectors 47 are also formed over the die 20. The RDL structure 45 is referred to as a fan-out RDL structure. In some embodiments, the RDL structure 45 includes a plurality of redistribution layers RDL1', RDL2', RDL3' stacked on and electrically connected to the connectors 18b of the die 20 or the TIV 14. The redistribution layers RDL1', RDL2', RDL3' are formed in and on the polymer layers PM1, PM2, PM3. In other words, the RDL structure 45 and the RDL structure 35 share the common polymer layers PM1, PM2, PM3.

The redistribution layer RDL1' penetrates through the polymer layer PM1 and is electrically connected to the connectors 18b of the die 20 and the TIVs 14. The redistribution layer RDL2' penetrates through the polymer layer PM2 and is electrically connected to the redistribution layer RDL1'. The redistribution layer RDL3' penetrates through the polymer layer PM3 and is electrically connected to the redistribution layer RDL2'.

In some embodiments, each of the redistribution layers RDL1', RDL2', RDL3' includes conductive materials. The conductive materials include metal such as copper, aluminum, nickel, titanium, alloys thereof, combinations thereof or the like, and is formed by an electroplating process. In some embodiments, the redistribution layers RDL1', RDL2', RDL3' respectively includes a seed layer (not shown) and a metal layer formed thereon (not shown). The seed layer may be a metal seed layer such as a copper seed layer. In some embodiments, the seed layer includes a first metal layer such as a titanium layer and a second metal layer such as a copper layer over the first metal layer. The metal layer may be copper or other suitable metals. In some embodiments, the materials and the forming method of the redistribution layers RDL1', RDL2', RDL3' of the RDL structure 45 may be the same as or different from those of the redistribution layers RDL1, RDL2, RDL3 of the RDL structure 35. The structural features of the RDL structure 45 and the RDL structure 35 are different and are described as below.

In some embodiments, the redistribution layers RDL1', RDL2', RDL3' respectively include a plurality of vias V and a plurality of traces T connected to each other. The vias V penetrate through the polymer layers PM1, PM2, PM3 to connect the traces T of the redistribution layers RDL1', RDL2', RDL3', and the traces T are respectively located on the polymer layers PM1, PM2, PM3, and are respectively extending on the top surface of the polymer layers PM1, PM2, PM3.

The shapes and structural features of the vias V and traces T of the redistribution layers RDL1', RDL2', RDL3' are different from the vias V1, V2, V3 and the conductive plates M1, M2, M3 (FIG. 2K) of the redistribution layers RDL1, RDL2, RDL3, respectively. Referring to the top view TV of the via V and the trace T of the RDL structure 45, the vias V are not ring-shaped and are solid, the top view of the vias V may be circular, oval, or other suitable shapes. The traces T are not plate, but are conductive lines routing on the polymer layers PM1, PM2, PM3 and are electrically connected to each other. In some embodiments, the trace T is line-shaped. In some embodiments, in the same layer of the redistribution layer, the contact area between one via V and the corresponding trace T of the RDL structure 45 is much less than the contact area between one via V1, V2, or V3 and the corresponding conductive plate M1, M2, or M3 (FIG. 2K) of the RDL structure 35. In some embodiments, the contact area between one via V1, V2, or V3 and the corresponding conductive plate M1, M2, or M3 (FIG. 2K) of the raft-type RDL structure 35 is greater than about 8 times (such as 8 times to 32 times) of the contact area between one via V and the corresponding trace T of the RDL structure 45.

In some embodiments, in each of the redistribution layers RDL1', RDL2', RDL3' of the RDL structure 45, the number of the trace T may be not equal to the number of the via V. In some embodiments, one trace T may be connected to a plurality of corresponding vias V. That is to say, each of the redistribution layers RDL1', RDL2', RDL3' includes one trace T and a plurality of vias V in some embodiments.

In some embodiments, a conductive layer 46 penetrates through the protection layer 36, and is formed on the redistribution layer RDL3' of the RDL structure 45 exposed by an opening of the protection layer 36. The conductive layer 46 may include a material similar to, the same as or different from that of the redistribution layer RDL1', RDL2', RDL3'. In some embodiments, the conductive layer 46 is also referred to as an under-ball metallurgy (UBM) layer for ball mounting. Thereafter, the plurality of connectors 47 are formed over and electrically connected to the conductive layer 46. In some embodiments, the connectors 47 are made of a conductive material with low resistivity, such as Sn, Pb, Ag, Cu, Ni, Bi or an alloy thereof, and are formed by a suitable process such as evaporation, plating, ball drop, or screen printing. In alternative embodiments, the connectors 47 may be controlled collapse chip connection (i.e. C4) bumps formed by a C4 process. The connectors 47 are electrically connected to the die 20 through the conductive layer 46 and the RDL structure 45. In some embodiments, similar to the connector 40, the connector 47 may also be referred to as a conductive terminal. The connector 47 and the connector 40 may be the same type or different types of connectors. In some embodiments, the connector 47 is a solder ball while the connector 40 is a bump, but the disclosure is not limited thereto.

Figure 1C:
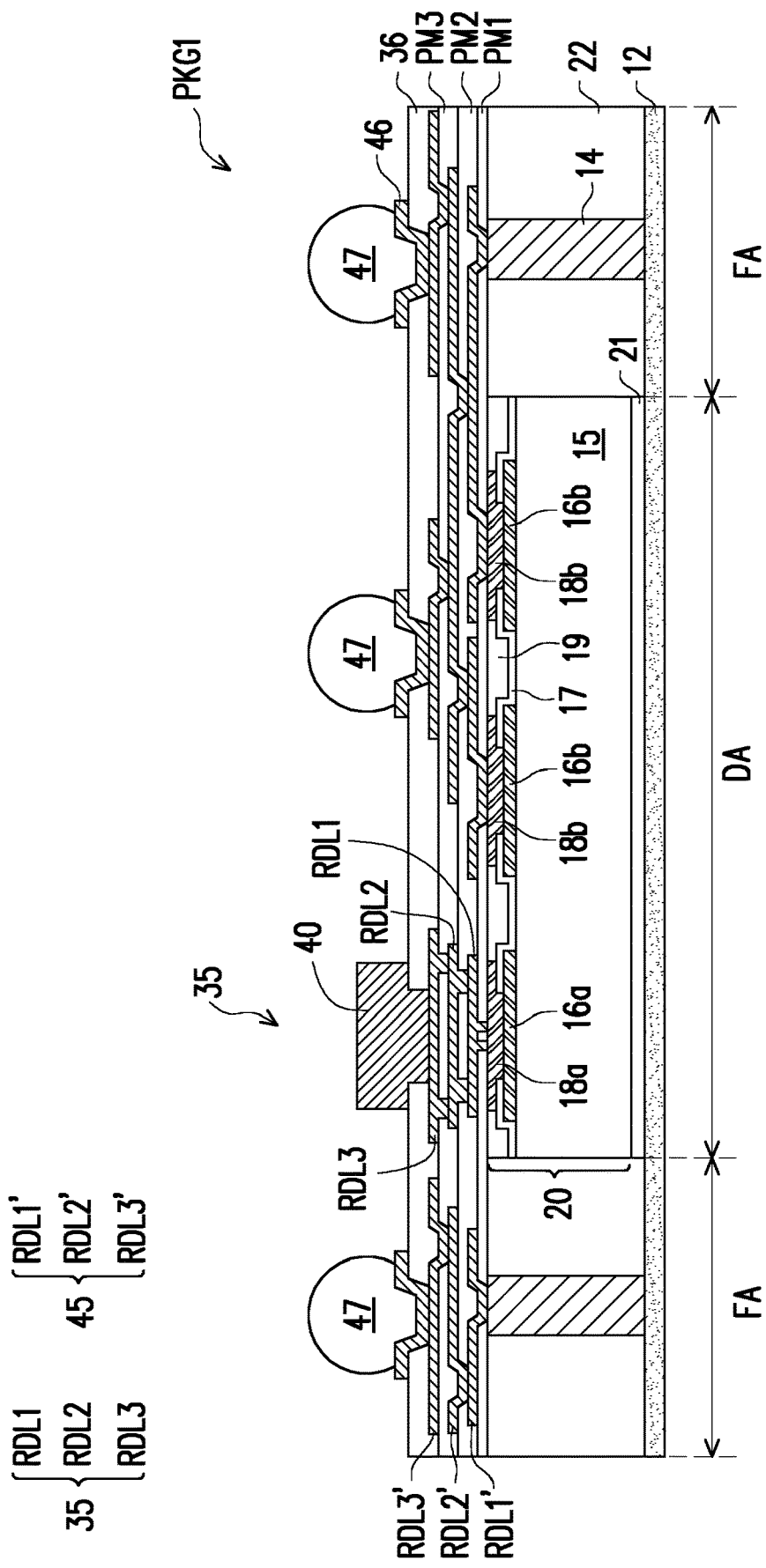

Referring to FIG. 1B and FIG. 1C, in some embodiments, the de-bonding layer 11 is decomposed under the heat of light, such that the carrier 10 is released, and a package structure PKG1 is thus completed.

Referring to FIG. 1C, in some embodiments, the package structure PKG1 includes the die 20, the encapsulant 22, the RDL structure 35, the RDL structure 45, the connectors 40 and the connectors 47. In some embodiments, the package structure PKG1 is a fan-out package including a die region DA and a fan-out region FA. The die region DA refers to a region within the die area which is directly over or under the die 20. The fan-out region FA refers to a region other than the die region DA. The fan-out region FA is exceed or out of the die region DA and laterally protruding from sidewalls of the die 20.

In some embodiments, the RDL structure 35 and the RDL structure 45 are different types of RDL structures. Referring to FIG. 1C, the RDL structure 35 may be a raft-type RDL structure which is formed within the die region DA of the package structure PKG1. In some embodiments, the raft-type RDL structure 35 is completely formed within the die region DA and is not extending to the fan-out region FA. In some embodiments, all of the vias and conductive plates of the raft-type RDL structure 35 are located within the die-region DA, but the disclosure is not limited thereto. In some other embodiments, some of the conductive plate of the raft-type RDL structure 35 may slightly exceed the die region DA, and include a small portion located in the fan-out region FA.

The RDL structure 45 is a fan-out RDL structure for redistributing I/O pads of the die 20 and is formed extending from the die region DA to the fan-out region FA. In some embodiments, the RDL structure 35 and the RDL structure 45 are used for different functions. The raft-type RDL structure 35 may be connected to the pads 16a which may be power I/O pad, the fan-out RDL structure 45 may be connected to the pads 16b which may be signal I/O pad. In some embodiments, the raft-type RDL structure 35 and the fan-out RDL structure 45 are electrically isolated from each other.

The connectors 40 and connectors 47 are connected to the raft-type RDL structure 35 and the fan-out RDL structure 45, respectively. In some embodiments, the connectors 40 and 47 are also referred as conductive terminals. The connectors 40 are located within the die region DA. In some embodiments, all of the connectors 40 are formed within the die region DA and are not formed in the fan-out region FA of the package structure PKG1. In some embodiments, some of the connectors 47 are located within the die region DA, and some other connectors 47 are located in the fan-out region FA.

Figure 1D:
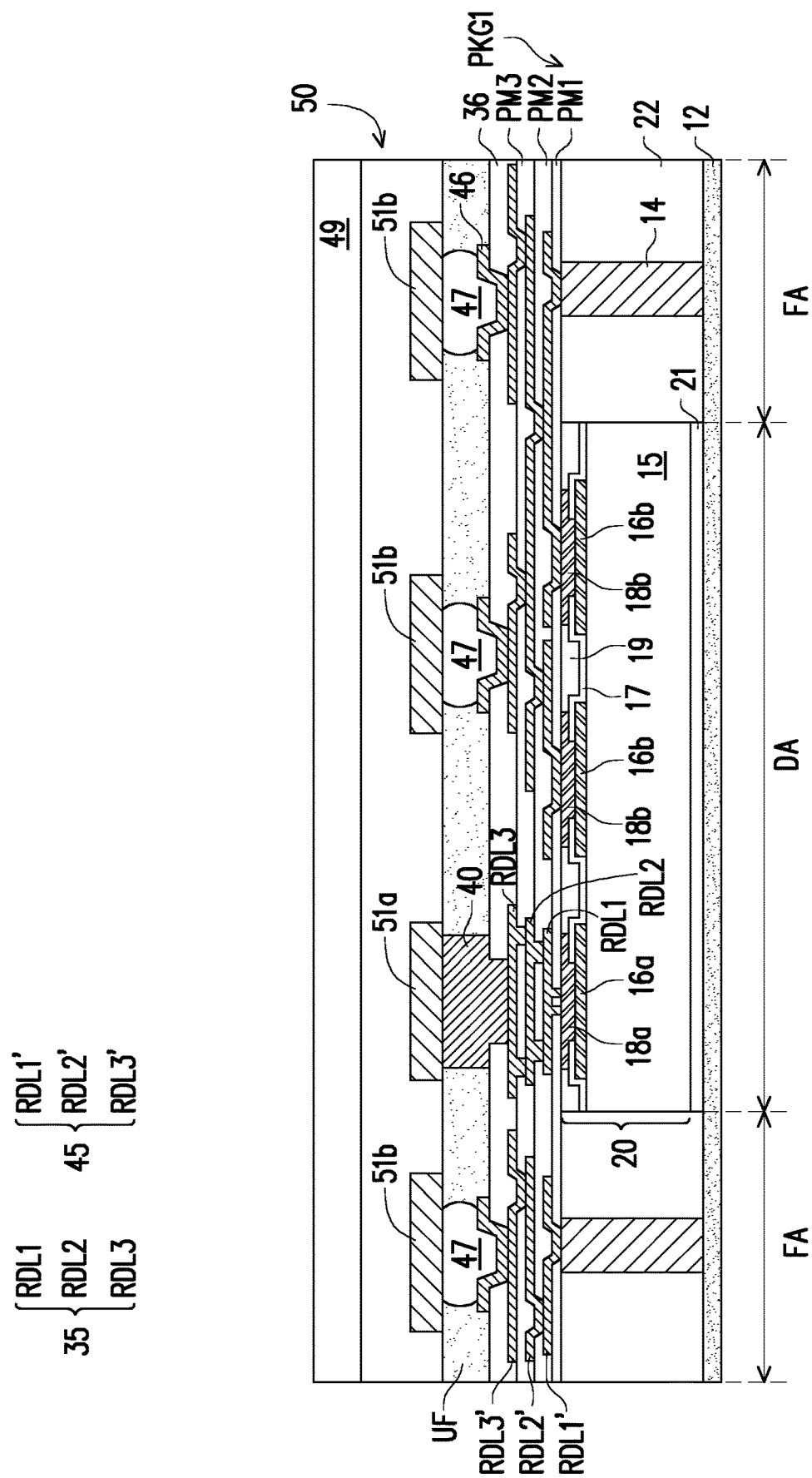

Referring to FIG. 1D, in some embodiments, the package structure PKG1 may further be connected to a package component 50 through the connectors 40 and 47. An underfill layer UF may be formed to fill the space between the package structure PKG1 and the package component 50. The package component 50 may be a printed circuit board (PCB), a flex PCB, or the like. In some embodiments, the package component 50 includes a substrate 49 and a plurality of pads 51a and 51b over the substrate 49. The substrate 49 may include materials the same as or different those of the substrate 15 of the die 20. The pads 51a and 51b may include materials similar to, the same as or different from those of the pads 16a, 16b of the die 20. The pads 51a and the pads 51b may be the same types of pads or different types of pads.

In some embodiments, the pads 51a may be power I/O pads (which is the same type of pad as the pad 16a), and are electrically connected to the pads 16a of die 20 through the connector 40 and the raft-type RDL structure 35. In some embodiments, as the raft-type RDL structure 35 is formed within the die region DA directly over the pad 16a of the die 20 without routing, and the vias V1, V2, V3 and the conductive plates M1, M2, M3 are vertically stacked on the pads 16a, the power conducting path between the pad 16a of the die 20 of the package structure PKG1 and the pad 51a of the package component 50 is quite short, and the power loss is significantly reduced.

In some embodiments, the pads 51b may be signal I/O pads (which is the same type of pad as the pad 16b), and is electrically connected to the pads 16b of the die 20 through the connectors 47 and the RDL structure 45.

Figure 10A:
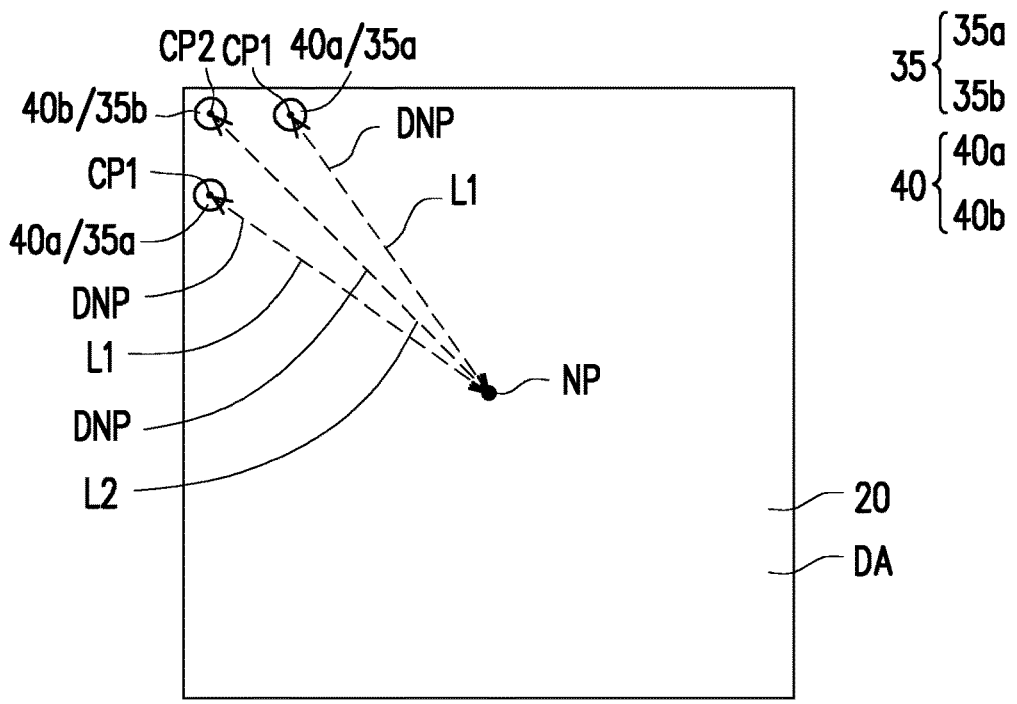
FIG. 10A and FIG. 10B are top views of a raft-type RDL structure and a connector thereon according to some embodiment of the disclosure.

FIG. 10A is a top view of the connectors 40 and the raft-type RDL structure 35 underlying thereof within the die region DA of the package structure PKG1. Referring to FIG. 1C, FIG. 1D and FIG. 10A, although only one raft-type RDL structure 35 is illustrated in FIG. 1C and FIG. 1D, but the number of the raft-type RDL structure 35 is not limited thereto. One or more raft-type RDL structure 35 may be formed on the die 20 within the die region DA. As shown in FIG. 10A, a plurality of raft-type RDL structures 35a and 35b are formed at one corner portion of the die region DA, the locations of the raft-type RDL structures shown in FIG. 10A are merely for illustration, and the disclosure is not limited thereto. The raft-type RDL structures 35 may be formed at one or more corner portions of the die region DA or the middle portion or close to the middle portion of the die region DA. In other word, a plurality of raft-type RDL structures 35a and 35b may be randomly formed within the die region DA. The number of the raft-type RDL structure 35 shown in FIG. 10A is also for illustration, and the disclosure is not limited thereto. In some embodiments, some of the raft-type RDL structures 35a and 35b are served as dummy RDL structure. The dummy RDL structure may or may not connect to the pad 18a. Herein, when elements are described as "dummy", the elements are electrically floating or electrically isolated from other elements. For example, as shown in FIG. 10A, the raft-type RDL structure 35b located at the most corner of the die region DA is a dummy RDL structure, and the connector 40a thereon is a dummy connector.

Figure 3B:
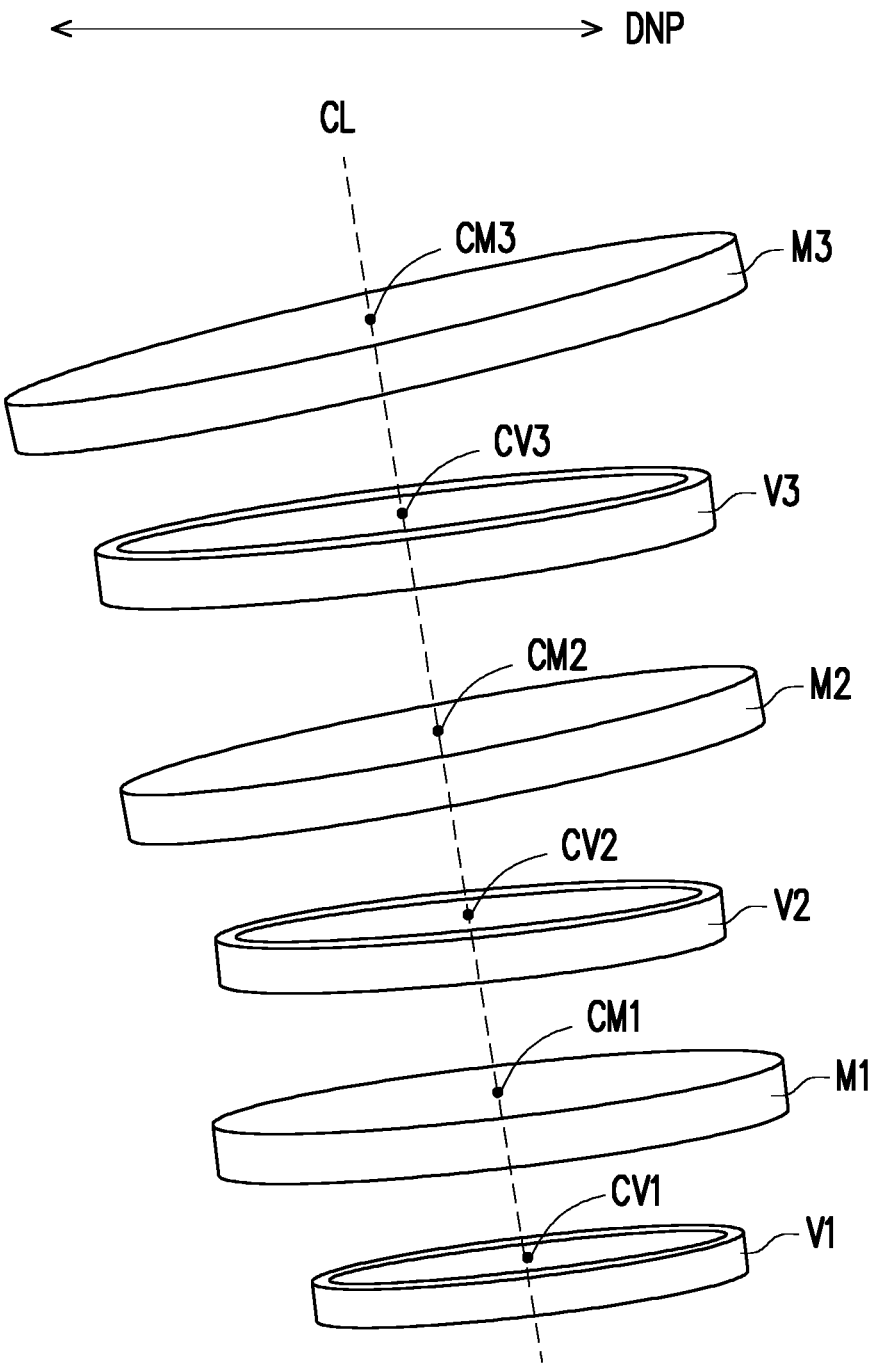

Referring to FIG. 1D, FIG. 3B and FIG. 10A, in some embodiments, coefficients of thermal expansion (CTE) mismatch may exist between the package structure PKG1 and the package component 50. In some embodiments, when bonding the package structure PKG1 and the package component 50 through the connectors 40 and 47, subjected to temperature loading, in the raft-type RDL structure 35, most driving force from the CTE mismatch is applied on the redistribution layers RDL1, RDL2, RDL3, and the redistribution layer RDL1, RDL2, RDL3 may tilt along a distance to neutral point (DNP) direction, as shown in FIG. 3B. In some embodiments, the driving forces applied on each of the redistribution layer RDL1, RDL2, RDL3 may be different from each other, resulting in the tilt degrees of redistribution layers RDL1, RDL2, RDL3 may be different from each other. As such, the redistribution layers RDL1, RDL2, RDL3 may be not parallel with each other. However, the disclosure is not limited thereto. The ring-shaped or donut-shaped vias V1/V2/V3 may enhance the strength of the vias V1/V2/V3 as well as the strength of the conductive plate M1/M2/M3, and further reduce RDL strain and polymer layer stress, thereby the RDL crack issue is avoided. It is noted that the DNP direction of each raft-type RDL structure 35a or 35b is defined as a direction from a center point CP1/CP2 of the raft-type RDL structures 35a/35b to the neutral point (NP) of the die 20. The neutral point of the die 20 refers to the centermost point NP of the die 20. In some embodiments, the center point CP1/CP2 of the raft-type RDL structure 35a/35b refers to the center points of the vias and conductive plates thereof. As the vias and the conductive plates of the raft-type RDL structure are coaxial, the center pints of the vias and the conductive plates are aligned or overlapped with each other in the top view.

In some embodiments, the driving force from CTE mismatch applied to the RDLs of the raft-type RDL structure 35 may be calculated as: driving force=CTE difference×L, wherein the CTE difference refers to the CTE difference between the package structure PKG1 and the package component 50, and L refers to the distance L between the center point CP1/CP2 of raft-type RDL structure 35a/35b (that is, the center points of the vias and conductive plates) and the neutral point NP of the die 20. In some embodiments, the CTE difference is a certain value. That is to say, the longer the distance from the neutral point NP of the die 20, the greater the driving force from CTE mismatch applied to the RDLs of the raft-type RDL structure 35. For example, as shown in FIG. 10A, the distance L2 between the center point CP2 of the raft-type RDL structure 35b and the neutral point NP of the die 20 is larger than the distance L1 between the center point CP1 of the raft-type RDL structure 35a and the neutral point NP of the die 20. Therefore, the driving force due to CTE mismatch applied to the raft-type RDL structure 35b is larger than that of the raft-type RDL structure 35a. It is understood that, within the die region DA, the distance between center points of the components on most corners of the die 20 and the neutral point NP of the die 20 is longest, so the driving force applied to the components (such as, the raft-type RDL structure 35b) on the most corners of the die 20 is the greatest. In the embodiments in which the raft-type RDL structure 35b is a dummy RDL structure, the dummy RDL structure may help to reduce the adverse affection of CTE mismatch on the package structure PKG1.

Figure 10B:
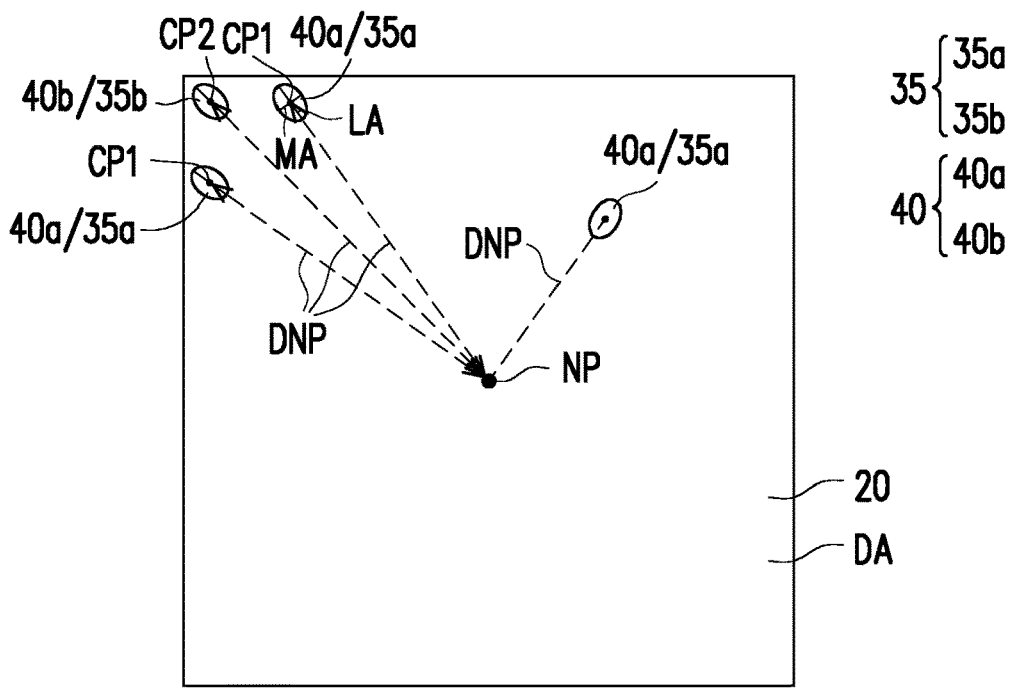

In the embodiment of FIG. 10A, the top view of the RDL structure 35 is shown as a circular shape, which represent the vias of the raft-type RDL structure 35 are circular ring shaped, and the conductive plated thereof are round disc shaped, but the disclosure is not limited thereto. In some other embodiments, referring to FIG. 10B, the top view of raft-type RDL structure 35 are shown in an oval shape, which represent the vias of the raft-type RDL structure 35 may be oval ring-shaped or/and the conductive plates thereof may be oval disc shaped, and the long diameter of the oval ring-shaped vias are oriented such that the longest diameter thereof points toward the neutral point NP of the die 20. That is to say, the longer axis LA of the oval ring shaped via of the raft-type RDL structure 35 is configured as along the DNP direction thereof, and the minor axis of the oval ring shaped via of the raft-type RDL structure 35 is perpendicular to the DNP direction thereof.

In the first embodiment, the raft-type RDL structure includes vias and conductive plates formed within the die region of the package structure, the vias are ring-shaped, and the conductive plates are disk shaped. Therefore, the contact area between the vias and the conductive plates are increased, the strength of the via and the conductive plate are thus enhanced, the RDL strain and polymer layer stress are significantly reduced, and RDL crack issue is thus avoided. In some embodiments, the RDL strain or stress of the enhanced raft-type RDL structure may be reduced by about 19% or about 31% compared with raft-type RDL structure with conventional via structure. Further, through the raft-type RDL structure, the power loss is significantly reduced. As a result, the reliability of the package structure is improved. In addition, in some embodiments, the vias and the conductive plates are coaxial, therefore, the occupied space of the coaxial raft-type RDL structure is reduced, and the redistribution layer may have larger layout space.

Figure 6A:
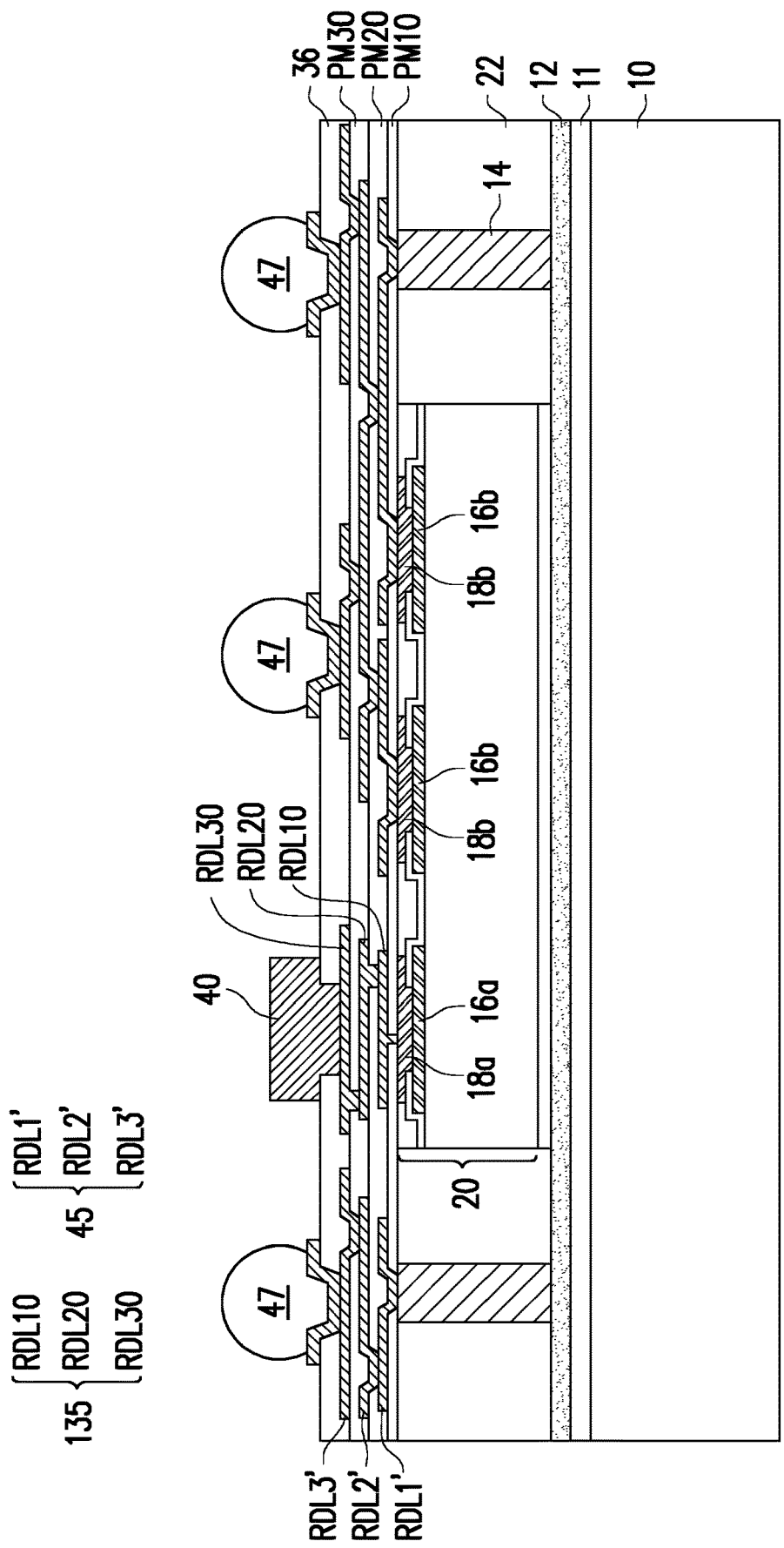
FIG. 6A to FIG. 6C are schematic cross-sectional views illustrating a method of forming a package structure according to a second embodiment of the disclosure.
Figure 6B:
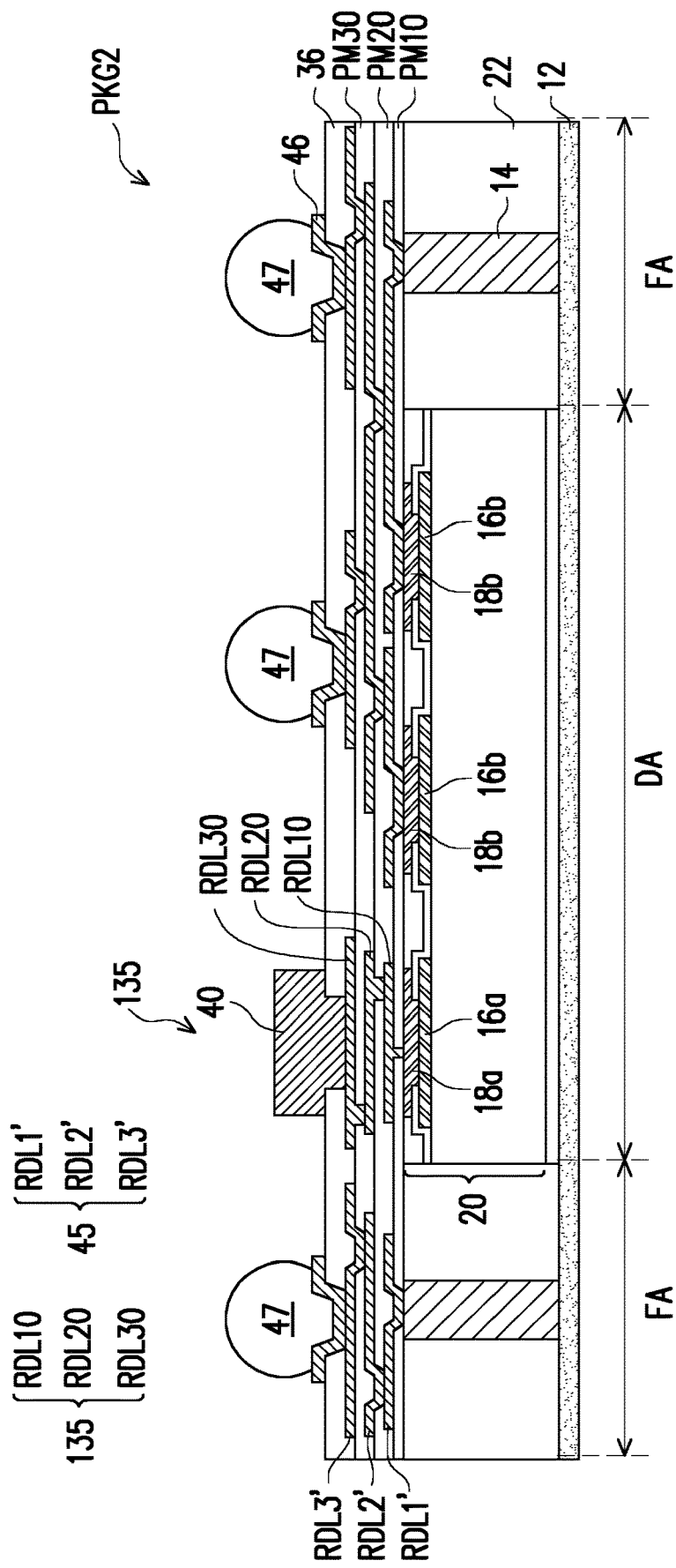
Figure 6C:
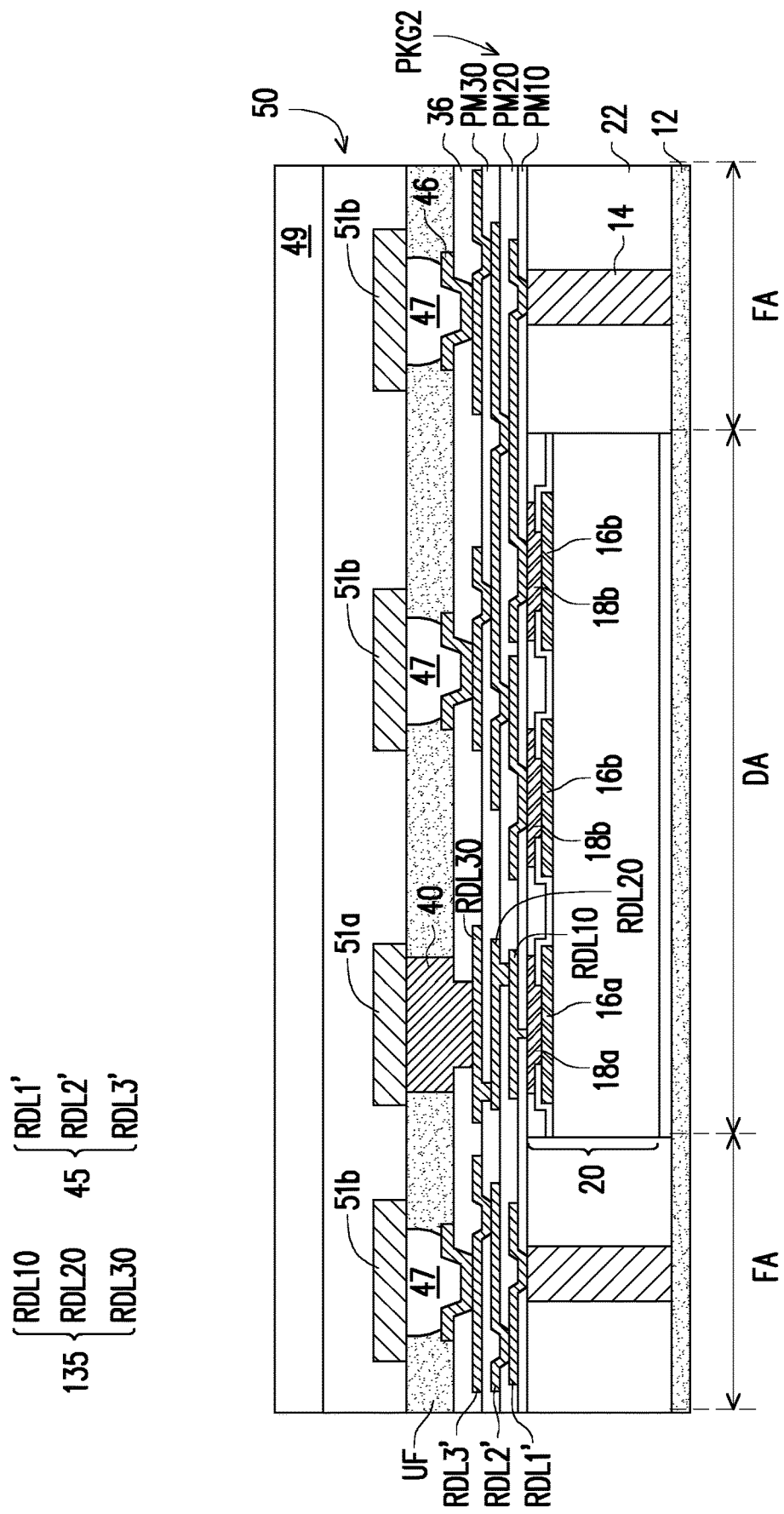

FIG. 6A to FIG. 6C are schematic cross-sectional views illustrating a method of forming a package structure according to a second embodiment of the disclosure. FIG. 7A to FIG. 7K are schematic cross-sectional views illustrating a method of forming a raft-type RDL structure according to the second embodiment of the disclosure. The second embodiment is similar to the first embodiment, except that the structures of the vias of the raft-type structure are different from those in the first embodiment. The forming method and materials of the package structure in the second embodiment are similar to those in the first embodiment, and are briefly described as below.

Referring to FIG. 1A and FIG. 6A, after the encapsulant 22 is formed as shown in FIG. 1A, polymer layers PM10, PM20, PM30 and RDL structures 135 and 45 are formed on the die 20 and the encapsulant 22. A connector 40 is formed on the RDL structure 135, and connectors 47 are formed on the RDL structure 45. In some embodiments, the RDL structure 135 and the RDL structure 45 are different types of RDL structures. In some embodiments, the RDL structure 135 is a raft-type structure, and the RDL structure 45 is a fan-out RDL structure. The materials and the forming method of the RDL structure 135 may be the same as or different from those of the RDL structure 35 of the first embodiment. The forming method of RDL structure 135 is described as below.

Figure 7A:
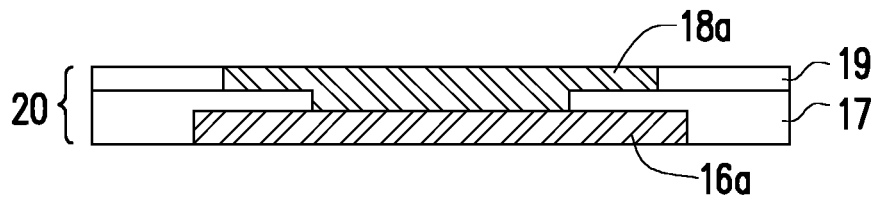
FIG. 7A to FIG. 7K are schematic cross-sectional views illustrating a method of forming a raft-type RDL structure according to the second embodiment of the disclosure.
Figure 7B:
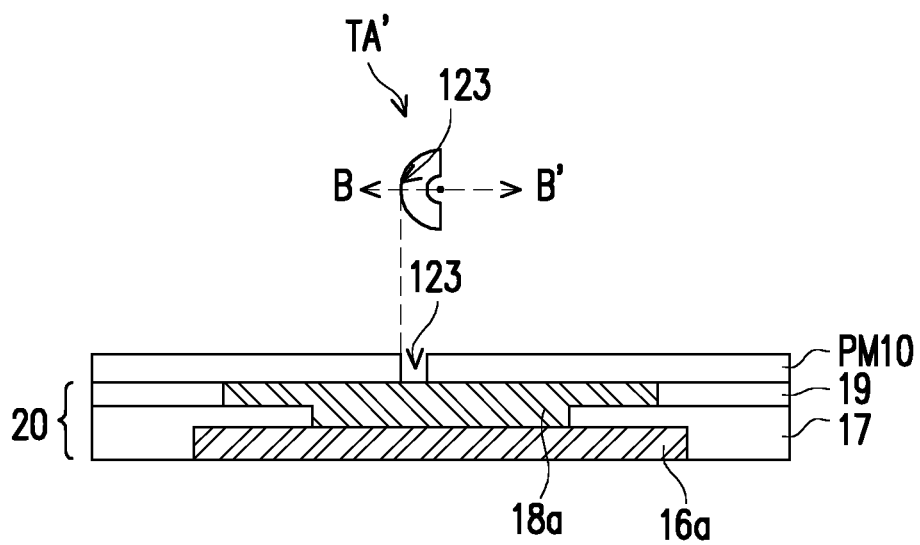

Referring to FIG. 1A, FIG. 7A and FIG. 7B, FIG. 7A is an enlarged view of the region A in FIG. 1A. A polymer layer PM10 is formed on the structure of FIG. 1A. The polymer layer PM10 is patterned to form a via hole 123 in the polymer layer PM10. The material, the forming method and the patterning method of the polymer layer PM10 are similar to, the same as, or different from those of the polymer layer PM1 described in the first embodiment, and are not described again. The via hole 123 penetrates through the polymer layer PM10 to expose a top surface of the connector 18a of the die 20. In some embodiments, the top view TA' of the via hole 123 is partial ring shaped. In an embodiment, the via hole 123 is semi-ring shaped or half-ring shaped, but the disclosure is not limited thereto. In some other embodiments, in the top view TA', the via hole 123 may be one third of a full ring, or more or less than a half ring, or more or less than a third of a full ring. The cross sectional view of the via hole 123 along a B-B' line of the top view TA' may be square, rectangle, trapezoid, or the like. The sidewall of the via hole 123 may be straight, inclined, or arced, or the like.

Figure 7C:
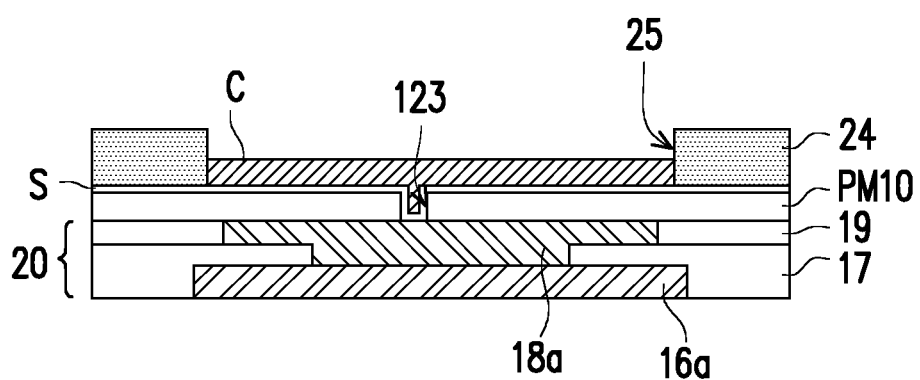
Figure 7D:
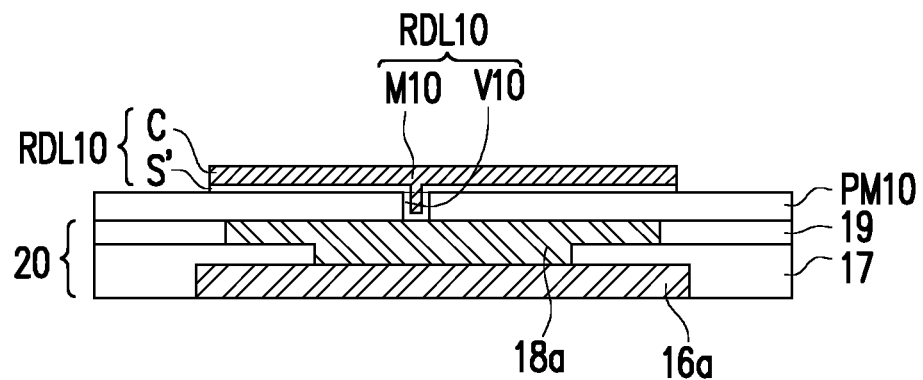

Referring to FIG. 7C and FIG. 7D, a seed layer S is formed on the polymer layer PM10, the seed layer S covers the top surface of the polymer layer PM10, and fills into the via hole 123 to cover the inner surface of the via hole 123. A mask layer 24 with an opening 25 is formed on the seed layer S. The opening 25 is overlapped with and in spatial communication with the via hole 123. Thereafter, a conductive layer C in formed on the seed layer S exposed by the mask layer 24. Thereafter, the mask layer 24 and the seed layer S not covered by the conductive layer C are removed, and a seed layer S' is remained. As a result, the conductive layer C and the seed layer S' underlying thereof form a redistribution layer RDL10. In some embodiments, the seed layer S' and the conductive layer C in the via hole 123 (FIG. 7C) form a via V10 of the redistribution layer RDL10, and the seed layer S' and the conductive layer C on the polymer layer PM10 and the via V10 form a conductive plate M10 of the redistribution layer RDL10. In other words, the redistribution layer RDL10 includes a via V10 and a conductive plate M10. The via V10 is located in the via hole 123, penetrating through the polymer layer PM10 to be in electrical contact with the connector 18a of the die 20. The conductive plate M10 is located on the via V10 and the polymer layer PM10, and is electrically connected to the die 20 through the via V10.

Figure 9A:
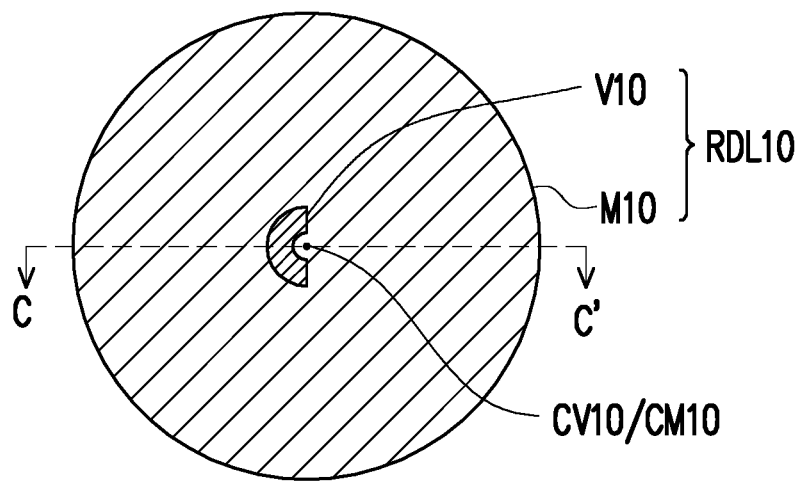
FIG. 9A is a top view of a via and a conductive plate of a raft-type RDL structure according to the second embodiment of the disclosure.
Figure 9B:
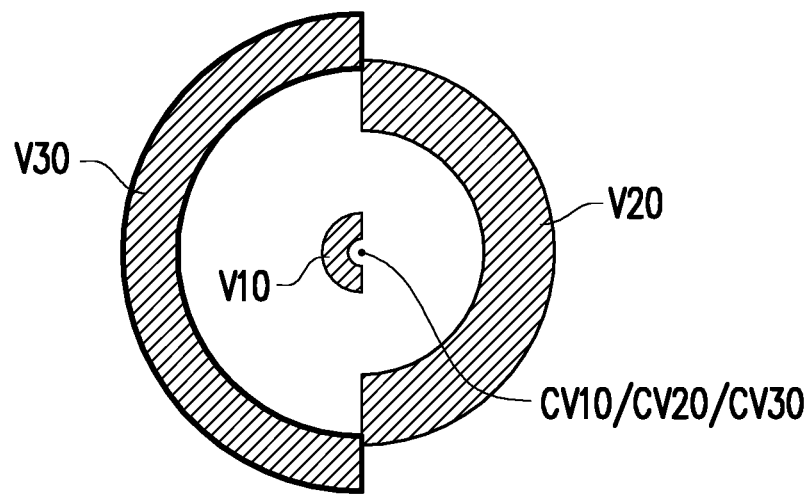
FIG. 9B is a top view of vias of a raft-type RDL structure according to the second embodiment of the disclosure.

Referring to FIG. 7D and FIG. 9A, in some embodiments, the top view of the via V10 is a partial ring. In an embodiment, the via V10 is semi-ring shaped or half-ring shaped, but the disclosure is not limited thereto. In some other embodiments, in the top view, the via V10 may be one third of a full ring, or more or less than a half ring, or more or less than a third of a full ring. In some embodiments, the via V10 may also be referred to as a curved line or a curved conductive line. The cross-section sectional view of the via V10 along a C-C' line of the top view thereof is square, rectangle, trapezoid, or the like. The sidewalls of the via V10 may be straight, inclined or arced, or the like. The shape of the conductive plate M10 is similar to, the same as or different from those of the conductive plate M1 (FIG. 2E) in the first embodiment, and is not described again.

In some embodiments, the via V10 and the conductive plate M10 are coaxial, that is, the center point CV10 of the via V10 and the center point CM10 of the conductive plate M10 are aligned with each other in a direction perpendicular to the top surface of the die 20. It is noted that, in the embodiments in which the via V10 is a partial ring, the center point CV10 of the via V10 refers to the center point of the ring.

Figure 7E:
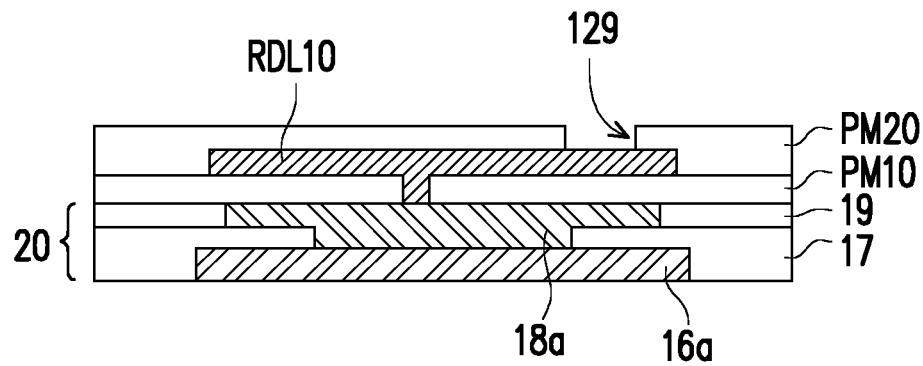
Figure 7F:
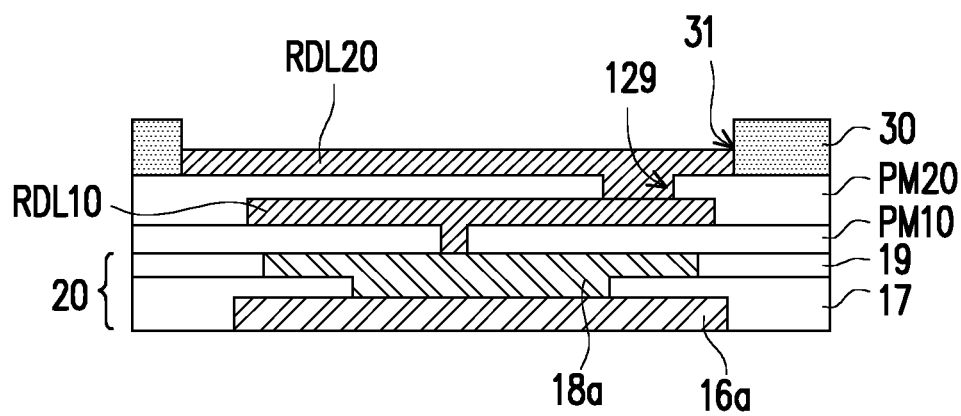
Figure 7G:
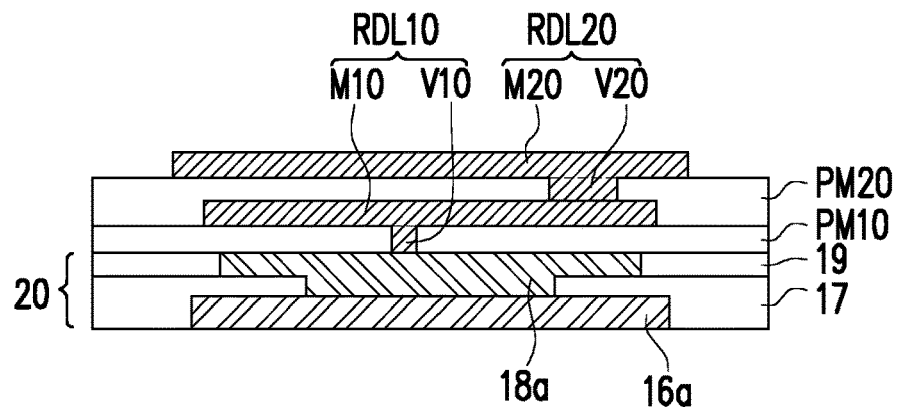

Referring to FIG. 7E to FIG. 7G, processes similar to those from FIG. 7B to FIG. 7D are performed, so as to form a polymer layer PM20 and a redistribution layer RDL20 on the polymer layer PM10 and the redistribution layer RDL10. For the sake of brevity, the seed layer and the conductive layer of the redistribution layer RDL10 are not specifically shown in the following drawings.

Referring to FIG. 7E, a polymer layer PM20 is formed on the polymer layer PM10 and the redistribution layer RDL10. The polymer layer PM20 is patterned to form a via hole 129, exposing a portion of the top surface of the redistribution layer RDL10. The shape of the via hole 129 is similar to the via hole 123 (FIG. 7B). In some embodiments, the size (such as, width) of the via hole 129 is larger than the size of the via hole 123, but the disclosure is not limited thereto.

Referring to FIG. 7F and FIG. 7G, a mask layer 30 with an opening 31 is formed on the polymer layer PM10, the opening 31 is overlapped with and in spatial communication with the via hole 129. A redistribution layer RDL20 is formed in the opening 31 and the via hole 129. Thereafter, the mask layer 30 is removed. It is noted that, the formation of the redistribution layer RDL20 may also include forming a seed layer and a conductive layer, which is similar to the formation of the redistribution layer RDL10, and for the sake of brevity, are not shown and described again.

Referring to FIG. 7G, in some embodiments, the redistribution layer RDL20 includes a via V20 and a conductive plate M20. The via V20 is located in the via hole 129 (FIG. 7E), penetrating through the polymer layer PM20 to be in electrical contact with the conductive plate M10 of the redistribution layer RDL10. The conductive plate M20 is located on the via V20 and the polymer layer PM20, and is electrically connected to the redistribution layer RDL10 through the via V20.

Figure 7H:
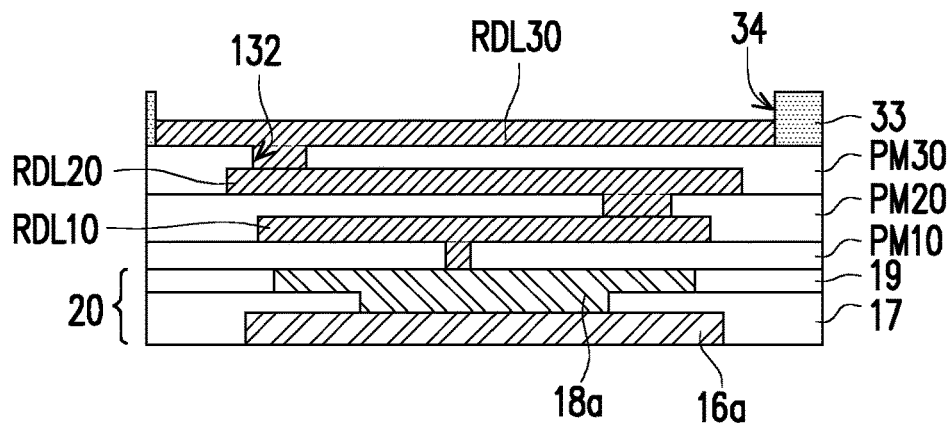
Figure 7I:
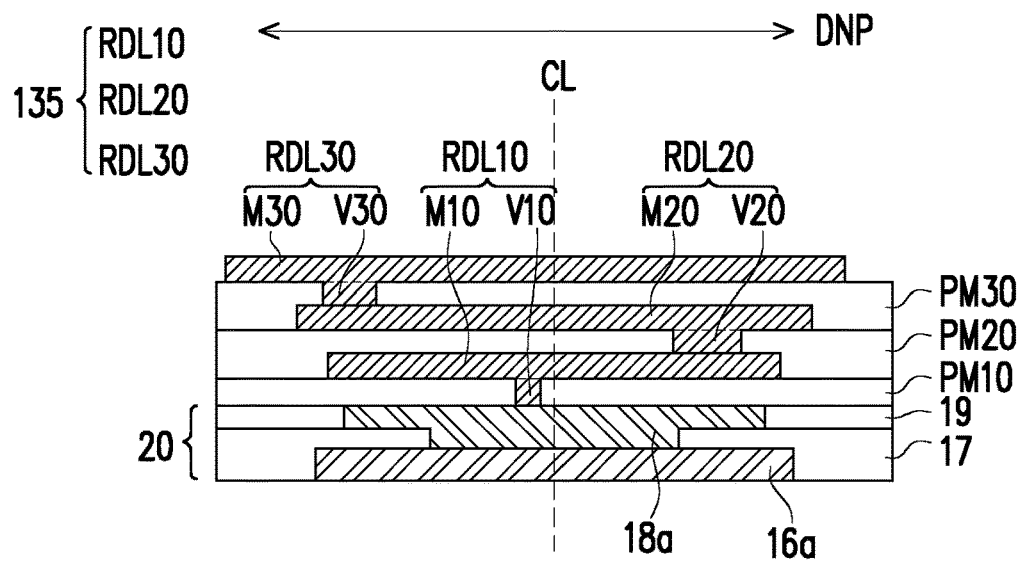

Referring to FIG. 7H to FIG. 7I, processes similar to those from FIG. 7B to FIG. 7D are performed, so as to form a polymer layer PM30 and a redistribution layer RDL30 on the polymer layer PM20 and the redistribution layer RDL20.

Referring to FIG. 7H, a polymer layer PM30 is formed on the polymer layer PM20 and the redistribution layer RDL30. The polymer layer PM30 is patterned to form a via hole 132, exposing a portion of the top surface of the redistribution layer RDL20.

A mask layer 33 with an opening 34 is formed on the polymer layer PM30, the opening 34 is overlapped with and in spatial communication with the via hole 132. A redistribution layer RDL30 is formed in the opening 34 and the via hole 132. Thereafter, the mask layer 33 is removed. It is noted that, in some embodiments, the redistribution layers RDL30 and RDL20 also include a seed layer (not shown) and a conductive layer (not shown) on the seed layer, which is similar to the redistribution layer RDL10, respectively.

Referring to FIG. 7I, in some embodiments, the redistribution layer RDL30 includes a via V30 and a conductive plate M30. The via V30 is located in the via hole 132 (FIG. 7H), penetrating through the polymer layer PM30 to be in electrical contact with the conductive plate M20 of the redistribution layer RDL20. The conductive plate M30 is located on the via V30 and the polymer layer PM30, and is electrically connected to the redistribution layer RDL20 through the via V30.

Still referring to FIG. 7I, an RDL structure 135 is thus completed. In some embodiments, the RDL structure 135 includes the redistribution layers RDL10, RDL20, RDL30 formed in and on the polymer layers PM10, PM20 and PM30. The number of the layers of the redistribution layers comprised in the RDL structure 135 shown in FIG. 7I is merely for illustration, and the disclosure is not limited thereto.

Figure 7J:
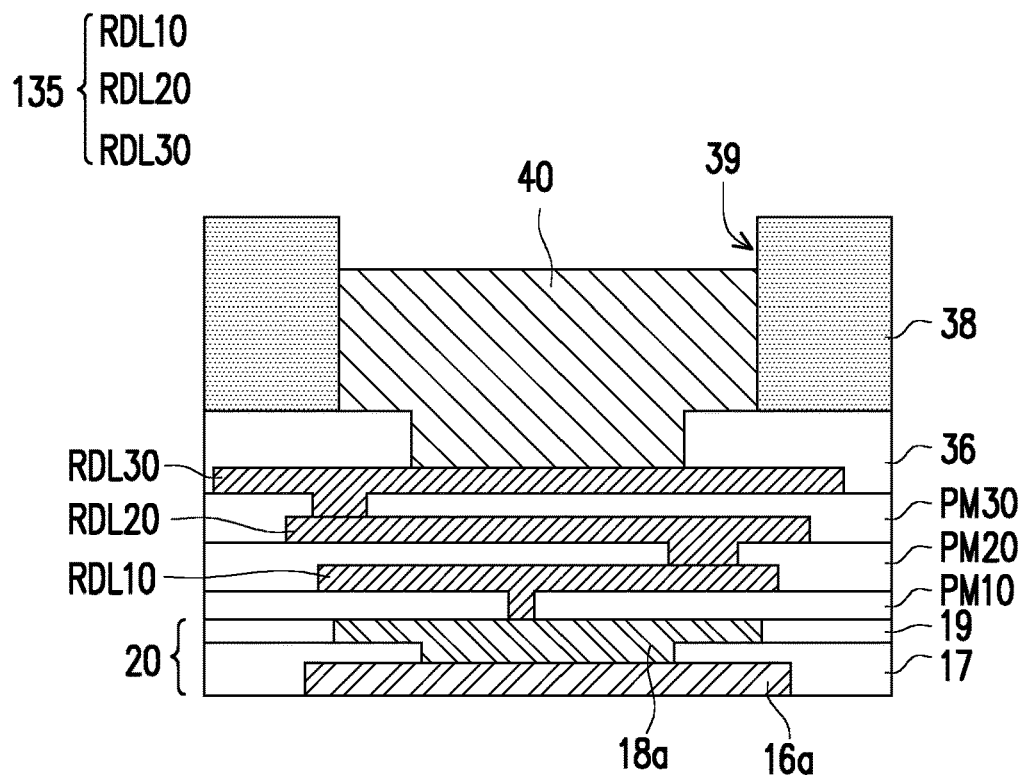
Figure 7K:
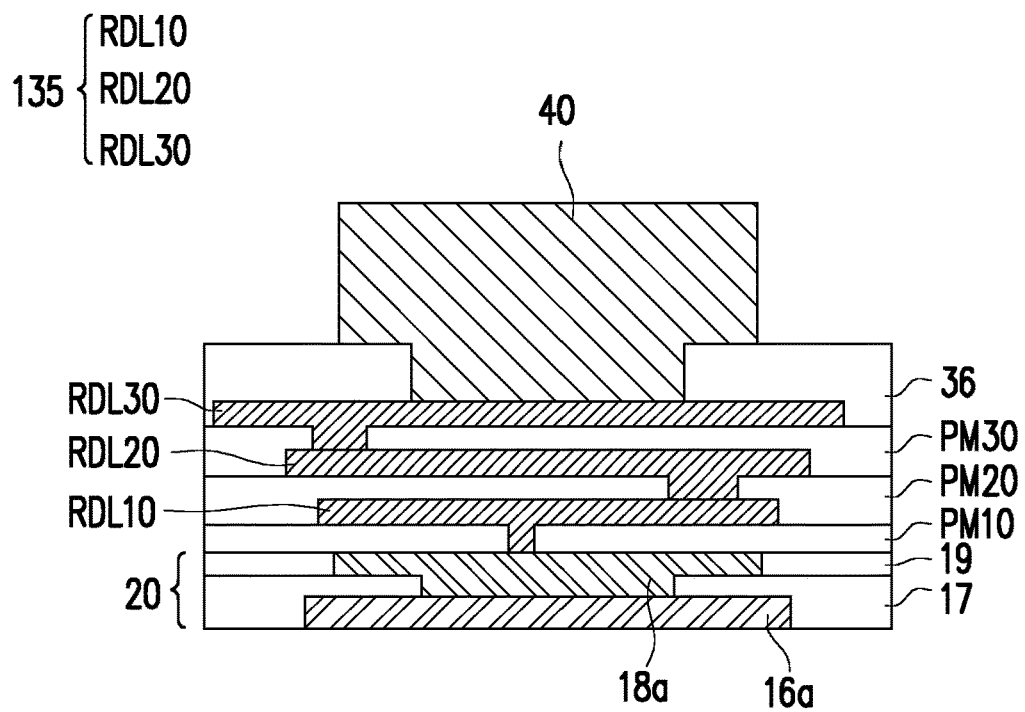

Referring to FIG. 7J and FIG. 7K, processes similar to FIG. 2L to FIG. 2N are performed, so as to form a protection layer 36 and a connector 40 on the polymer layer PM30 and the RDL structure 135. The connector 40 is in electrical contact with the redistribution layer RDL30 of the RDL structure 135, and is electrically connected to the die 20 through the RDL structure 135. The structural feature of the RDL structure 135 is described as below.

Figure 8A:
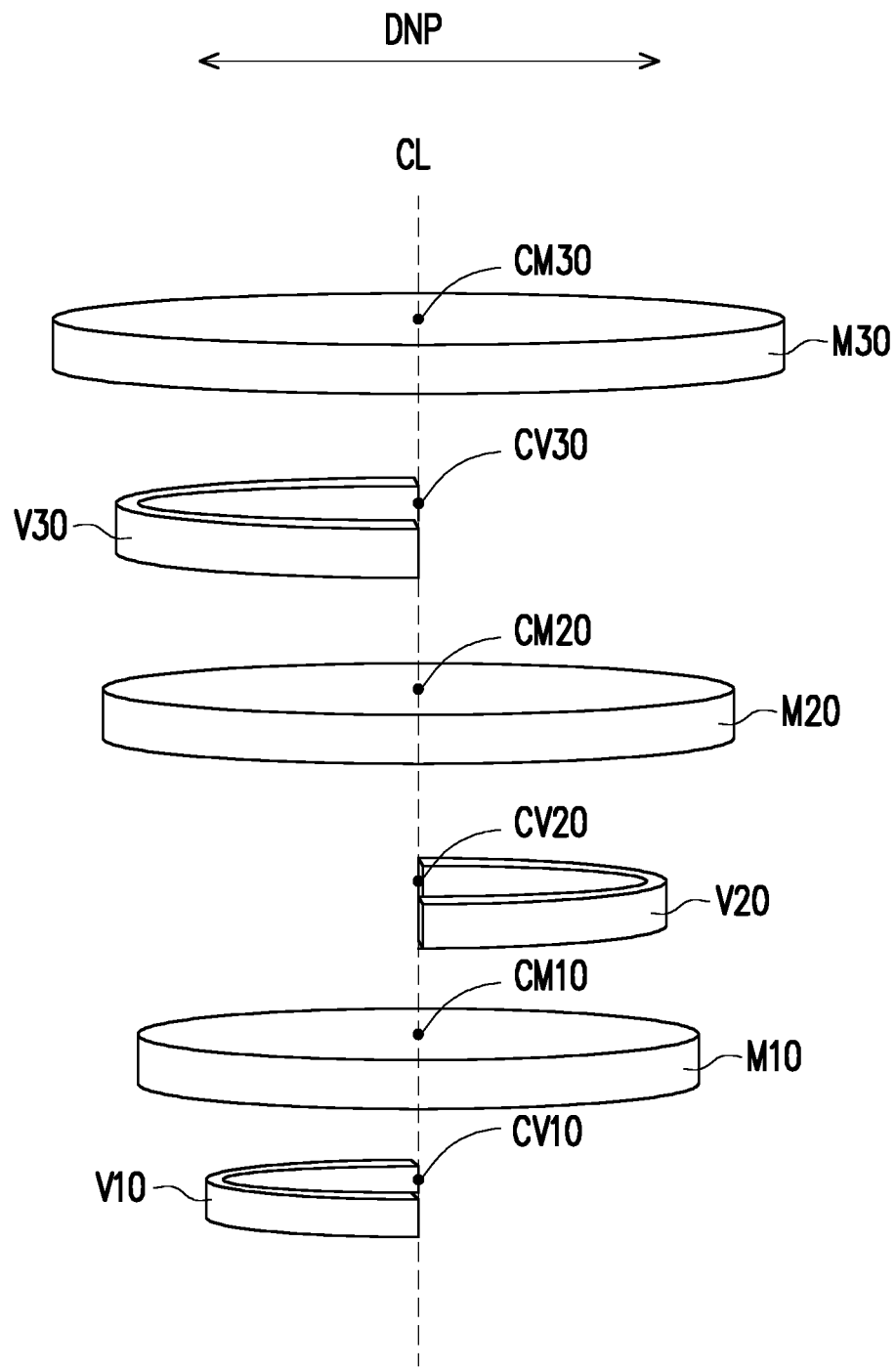
FIG. 8A to FIG. 8B are perspective views respectively illustrating a raft-type RDL structure according to the second embodiment of the disclosure.

Referring to FIG. 7I and FIG. 8A, in some embodiments, the RDL structure 135 includes three layers of stacked redistribution layers RDL1, RDL2, RDL3 electrically connected to each other. Each redistribution layer RDL1, RDL2, RDL3 includes a via and a conductive plate on the via. In some embodiments, in each redistribution layer RDL10, RDL20, RDL30 of the RDL structure 135, the number of the via is equal to the number of the conductive plate, such as one via correspond to one conductive plate. For example, the redistribution layer RDL10 includes only one via V10 and only one conductive plate M10, the redistribution layer RDL20 includes only one via V20 and only one conductive plate M20, the redistribution layer RDL30 includes only one via V30 and only one conductive plate M30, it is noted that, the vias V10, V20, V30 and the conductive plates M10, M20, M30 in FIG. 8A are separated just for ease of illustration, and it should understood they are connected to each other.

Referring to FIG. 7I, FIG. 8A, FIG. 9B and FIG. 9C, in some embodiments, the vias V10, V20, V30 have similar shapes in different sizes, but the disclosure is not limited thereto. The shapes and sizes of the vias V10, V20, V30 may be the same or different. In some embodiments, the vias V10, V20, V30 are semi-ring shaped, and are stagger (FIG. 9B) but not overlapped with each other when projected to the top surface of the die 20, but the disclosure is not limited thereto. Further, the vias V10, V20, V30 are coaxial, that is, the center points CV10, CV20, CV30 thereof are aligned with each other when projected to the top surface of the die 20. In some embodiments, referring to FIG. 9B and FIG. 9C, as shown in the top view, the vias V10, V20, V30 are arranged along a DNP direction which is defined from center points CV10/CV20/CV30 of the vias V10/V20/V30 to neutral point NP of the die 20. In some embodiments, the vias V10, V20, V30 are symmetrical with respect to the DNP direction thereof, respectively.

In some embodiments, the shapes and the structural features of the conductive plates M10, M20, M30 are similar to those of the conductive plates M1, M2, M3 as described in the first embodiment, and is not described again. The vias V10, V20, V30 and the conductive plates M10, M20, M30 are coaxial. That is to say, in some embodiments, the center points CV10, CV20, CV30 of the vias V10, V20, V30 and the center points CM10, CM20, CM30 of the conductive plates M10, M20, M30 are aligned with each other in a direction perpendicular to the top surface of the die 20.

Figure 9C:
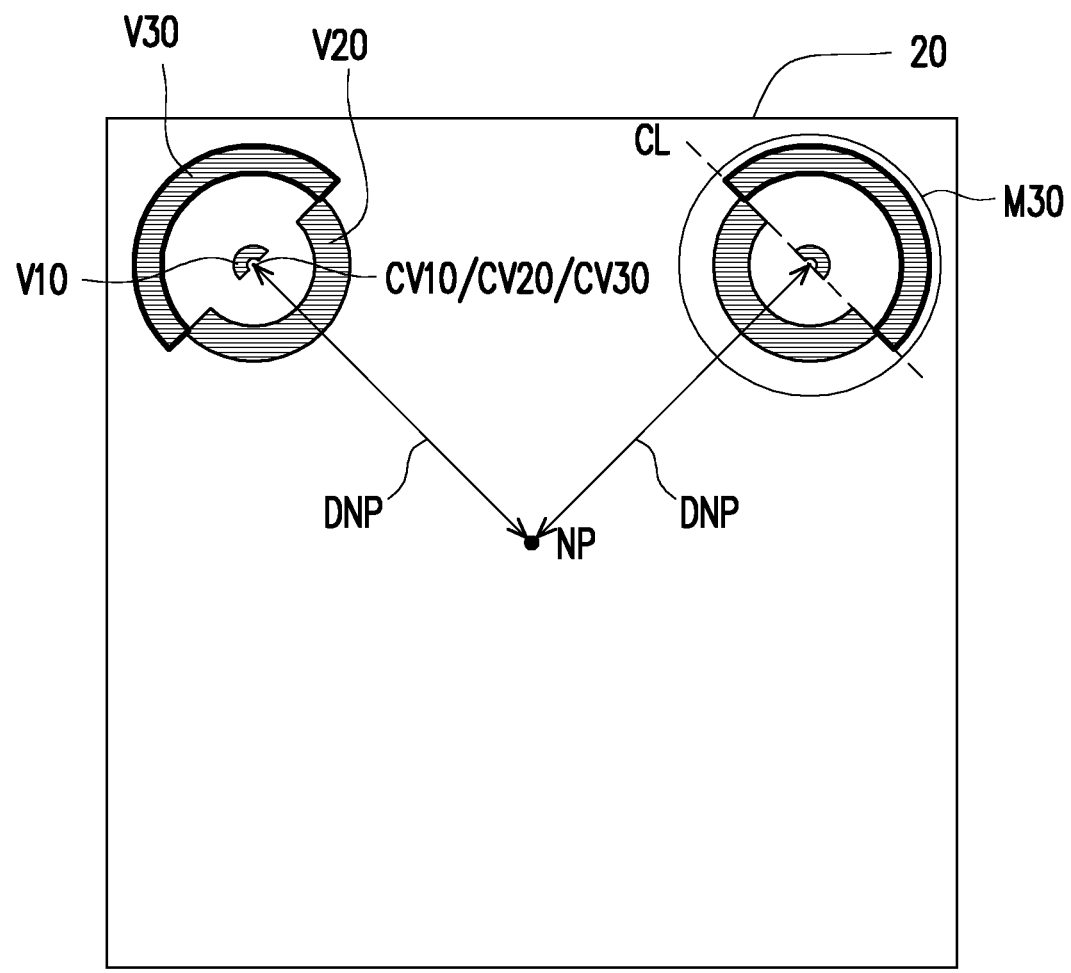
FIG. 9C is a top view illustrating arrangement of vias of a raft-type RDL structure in a die region according to the second embodiment of the disclosure.

In some embodiments, from a point of view, the RDL structure 135 has a spring structure, the vias V10, V20 or V30 of neighboring redistribution layers RDL10, RDL20, RDL30 are disposed at opposite lateral sides of a center line CL of the corresponding conductive plates M10, M20 or M30. For example, the via V10 and the via V20 are disposed at opposite lateral sides of the center line CL of the conductive plate M10, the via V20 and the via V30 are disposed at opposite lateral sides of the center line CL of the conductive plate M20. The center lines CL of the conductive plates M10, M20, M30 are aligned with each other. When viewed in the cross-sectional view FIG. 7I, the center line CL of each conductive plate M10, M20, M30 may refer to a center line through the center point CM10, CM20, CM30 (FIG. 8A) thereof, perpendicular to the top surface of the die 20 and perpendicular to the DNP direction. When viewed in the top view FIG. 9C, the center line CL of each conductive plate M10, M20, M30 may refer to a center line through the center point CM10, CM20, CM30 (FIG. 8A) thereof, parallel with the top surface of the die 20 and perpendicular to the DNP direction. For the sake of brevity, only conductive plate M30 is shown in FIG. 9C. In other words, the vias V10, V20 or V30 of neighboring redistribution layers RDL10, RDL20, RDL30 are disposed at opposite lateral sides of a central plane which is through the center points CM10, CM20, CM30 of the conductive plates M10, M20, M30, and perpendicular to the top surface of the die 20 or the top surfaces of the conductive plates and perpendicular to the DNP direction thereof. In some embodiments, the vias V10, V20 or V30 of neighboring redistribution layers RDL10, RDL20, RDL30 are completely staggered when projected to the top surface of the die 20. For example, the via V10 is completely staggered with the via V20, that is, in the redistribution layer RDL20, there is no via in a region at the same side as the via V10 with respect to the center plane through the conductive plate M10. The via V10 and the via V30 may be staggered, overlapped or partially overlapped. In some embodiments, the vias V10, V20, V30 may be staggered, partially overlapped, or overlapped with each other, as long as the RDL structure 135 has a spring structure.

Referring to FIG. 6A, similar to FIG. 1B, in some embodiments, during the formation of the RDL structure 135, the RDL structure 45 including the redistribution layers RDL1', RDL2', RDL3' is also formed in and on the polymer layers PM10, PM20, PM30. A plurality of connectors 47 are formed on the RDL structure 45, and electrically connected to the die 20 or/and the TIVs 14 through the RDL structure 45.

Referring to FIG. 6A and FIG. 6B, the de-bonding layer 11 is decomposed under the heat of light, such that the carrier 10 is released, and a package structure PKG2 is thus completed.

Referring to FIG. 6B, in some embodiments, the package structure PKG2 includes the die 20, the encapsulant 22, the RDL structure 135, the RDL structure 45, the connectors 40 and the connectors 47. The RDL structure 135 is a raft-type RDL structure and is formed within the die region DA of the package structure PKG2. The RDL structure 135 is configured as a spring structure. The RDL structure 45 is a fan-out RDL structure formed extending from the die region DA to the fan-out region FA of the package structure PKG2. The package structure PKG2 is similar to the package structure PKG1, except that the vias of RDL structure 135 are partial ring-shaped, and the RDL structure 135 has a spring structure, other features of the package structure PKG2 are substantially the same as those of the package structure PKG1, and is not described again.

Referring to FIG. 6C, the package structure PKG2 may further be connected to a package component 50 through the connectors 40 and 47. An underfill layer UF may be formed to fill the space between the package structure PKG2 and the package component 50.

Figure 8B:
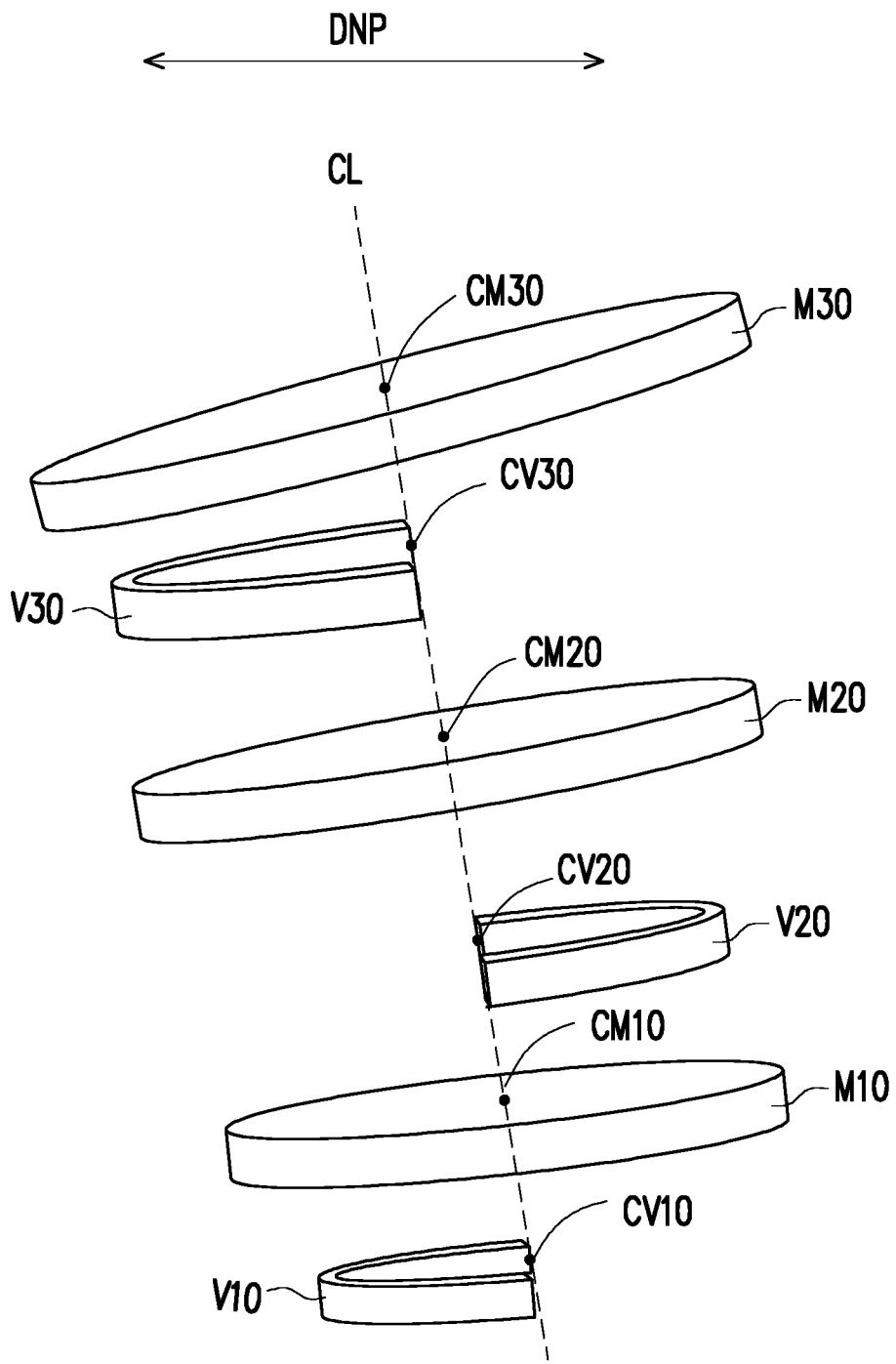

Referring to FIG. 6C, in some embodiments, CTE mismatch may exist between the package structure PKG2 and the package component 50, when subjected to temperature loading, most driving force from the CTE mismatch are applied to the RDLs of the raft-type RDL structure 135, as shown in FIG. 8B, the raft-type RDL structure 135 may tilt along the DNP direction. As the raft-type RDL structure 135 are formed to have a spring structure, therefore, the RDL strain or stress may be released or significantly reduced. In some embodiments, the RDL stain or stress may be reduced by about 27% or about 32% compared with raft-type structure having conventional via structure.

The location of the raft-type RDL structure of the second embodiment within die region is similar to those described in the first embodiment as shown in FIG. 10A, and some of the raft-type RDL structure at most corner of the die region may also serve as a dummy raft-type RDL structure.

In the second embodiment of the disclosure, beside the beneficial similar to the package structure PKG1 in the first embodiment, the package structure PKG2 further has the beneficial as follows: in the second embodiment, as the raft-type RDL structure has partial ring shaped vias and are configured as a spring structure, the vias of the RDLs are flexible, elastic or resilient. When CTE mismatch exists between the package structure PKG2 and the package component 50, the stress or stain of the RDLs may further be released and significantly reduced.

In the embodiments of the disclosure, although the raft-type RDL structure is integrated into a fan-out package structures as illustrated in the foregoing embodiments, but the disclosure is not limited thereto. The raft-type RDL structure of the disclosure may also applied to other kind of package structure, such as fan-in package.

According to some embodiments of the disclosure, a package structure includes a polymer layer on a die, a RDL structure and a conductive terminal. The RDL structure comprises a redistribution layer in and on the polymer layer. The redistribution layer comprises a via and a conductive plate. The via is located in and penetrating through the polymer layer to be connected to the die. The conductive plate is on the via and the polymer layer, and is connected to the die through the via. The conductive terminal is electrically connected to the die through the RDL structure. The via is ring-shaped.

According to alternative embodiments of the disclosure, a package structure includes a die, a RDL structure and a conductive terminal. The RDL structure is electrically connecting to the die. The RDL structure comprises a first redistribution layer having a first via and a first conductive plate. The first via penetrates through a first polymer layer to connect to the die, and the first conductive plate is on the first via and the first polymer layer. A number of the first via is equal to a number of the first conductive plate. The conductive terminal is electrically connected to the die through the RDL structure.

According to some embodiments of the disclosure, a method of forming a package structure including the following steps is provided. A die is provided. A dielectric layer is formed on the die. An RDL structure comprising a redistribution layer is formed in and on the dielectric layer. A conductive terminal is formed to electrically connect to the die through the RDL structure. Forming the RDL structure includes the following steps. The dielectric layer is patterned to form a via hole penetrating through the dielectric layer. The via hole is ring-shaped. A via is formed in the via hole of the dielectric layer. The via is connected to the die. A conductive plate is formed on the via and the dielectric layer. The conductive plate is connected to the die through the via.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A package structure, comprising:
   a die;
   an encapsulant, encapsulating sidewalls of the die;
   a dielectric layer on the die and the encapsulant;
   an RDL structure comprising a redistribution layer in and on the dielectric layer, wherein the redistribution layer comprises:
   a via located in and penetrating through the dielectric layer to be connected to the die, wherein the via is ring-shaped; and
   a conductive plate on the via and the dielectric layer, and is connected to the die through the via; and
   a conductive terminal, electrically connected to the die through the RDL structure, wherein the dielectric layer comprises a first portion enclosed by an inner sidewall of the via and in physical contact with the die; and a fan-out RDL structure in and on the dielectric layer, wherein the fan-out RDL structure is electrically isolated from the RDL structure, the fan-out RDL structure comprises a conductive via and a conductive trace, the conductive via penetrates through the dielectric layer to connect to the die, and the conductive trance is extending on the dielectric layer and electrically connected to the die through the conductive via, wherein an entire contact area between the conductive via and the conductive trace is less than an entire contact area between the via and the conductive plate.

2. The package structure of claim 1, wherein the dielectric layer further comprises a second portion outside an outer sidewall of the via, wherein the first portion and the second portion of the dielectric layer are separated from each other by the via therebetween.

3. The package structure of claim 1, wherein the via and the conductive plate are coaxial.

4. The package structure of claim 3, wherein the RDL comprises multilayers of the vias and conductive plates stacked alternately, and diameters of the conductive plates are increased progressively from bottom to top, the vias are staggered with each other or partially overlapped with each other.

5. The package structure of claim 1, wherein the via has a circular ring shape or an oval ring shape.

6. The package structure of claim 1, wherein the via is an oval hollow cylinder via, and a top view of the via has an oval ring shape, when viewed in a top view, a longer axis of the oval hollow cylinder via is along a Distance to Neutral Point (DNP) direction of the via, wherein the DNP direction is defined as a direction from a center point of the via to a neutral point of the die.

7. The package structure of claim 1, wherein a ratio of a top surface area of the via to a bottom surface area of the conductive plate ranges from 0.01 to 0.6.

8. The package structure of claim 1, wherein the RDL structure is located within a region directly over the die.

9. The package structure of claim 1, wherein the RDL structure is connected to a power I/O pad of the die, and the fan-out RDL structure is connected to a signal I/O pad of the die.

10. A package structure, comprising:
a die;
an encapsulant, laterally encapsulating sidewalls of the die;
an RDL structure disposed on the die and the encapsulant, and electrically connected to the die, wherein the RDL structure comprises:
a first redistribution layer having a first via and a first conductive plate, the first via penetrates through a first dielectric layer to connect to the die, and the first conductive plate is on the first via and the first dielectric layer, wherein the first via is a curved line;
a fan-out RDL structure, disposed on the die and the encapsulant, the fan-out RDL structure is laterally aside the RDL structure and electrically connected to the die, wherein the fan-out RDL structure comprises:
a fan-out redistribution layer comprising a conductive via and a conductive trace, the conductive via penetrates through the first dielectric layer to connect to the die, and the conductive trace is extending on the first dielectric layer and electrically connected to the die through the conductive via, wherein an entire contact area between the conductive via and the conductive trace is less than an entire contact area between the first via and the first conductive plate; and a conductive terminal, electrically connected to the die through the RDL structure,
wherein the first dielectric layer comprises a first portion surrounded by an inner sidewall of the first via and in physical contact with the die.

11. The package structure of claim 10, wherein the RDL structure further comprises:
a second redistribution layer having a second via and a second conductive plate, wherein the second via penetrates through a second dielectric layer to connect to the first conductive plate, and the second conductive plate is on the second via and the second dielectric layer,
wherein a number of the second via is equal to a number of second conductive plate; and
wherein the first via and the second via are staggered when projected to a top surface of the die.

12. The package structure of claim 11, wherein the first via and the second via are partial ring-shaped.

13. The package structure of claim 12, wherein the first via and the second via are symmetrical along a DNP direction thereof, respectively, the DNP direction is defined as a direction from the respective center point of the first via and the second via to a neutral point of the die.

14. The package structure of claim 13, wherein the first via and the second via are located at opposite lateral sides of a center line of the first conductive plate.

15. The package structure of claim 10, wherein the first via further comprises a second portion outside an outer sidewall of the first via opposite to the inner sidewall, and a bottom surface of the second portion is substantially coplanar with a bottom surface of the first portion.

16. A method of forming a package structure, comprising:
providing a die;
forming an encapsulant to laterally encapsulate sidewalls of the die;
forming a dielectric layer on the die and the encapsulant;
forming an RDL structure comprising a redistribution layer in and on the dielectric layer, comprising:
patterning the dielectric layer to form a via hole penetrating through the dielectric layer, wherein the via hole is ring-shaped;
forming a via in the via hole of the dielectric layer, the via is connected to the die, wherein the dielectric layer comprises a first portion enclosed by an inner sidewall of the via and in physical contact with the die; and
forming a conductive plate on the via and the dielectric layer, the conductive plate is connected to the die through the via;
forming a fan-out RDL structure in and on the dielectric layer, comprises:
forming a conductive via penetrating through the dielectric layer to connect to the die; and
forming a conductive trace extending on the dielectric layer, the conductive trace is electrically connected to the die through the conductive via, wherein an entire contact area between the conductive via and the conductive trace is less than an entire contact area between the via and the conductive plate, wherein the fan-out RDL structure is electrically isolated from the RDL structure; and forming a conductive terminal, electrically connected to the die through the RDL structure.

17. The method of claim 16, wherein the forming of the via hole separate the dielectric layer into the first portion and a second portion, the first portion and the second portion are separated from each other by the via therebetween.

18. The method of claim 16, wherein the conductive plate is formed to be coaxial with the via.

19. The method of claim 16, wherein the forming of the via hole comprises forming the via hole in an enclosed ring-shape.

20. The method of claim 16, wherein the forming of the via hole comprises forming the via hole in an unenclosed ring-shape.

* * * * *